United States Patent
Mandelli et al.

(10) Patent No.: US 10,104,322 B2
(45) Date of Patent: Oct. 16, 2018

(54) IMAGE SENSORS WITH NOISE REDUCTION

(71) Applicant: InVisage Technologies, Inc., Menlo Park, CA (US)

(72) Inventors: Emanuele Mandelli, Mountain View, CA (US); Ralph Beaudouin, East Palo Alto, CA (US); Aurelien Philippe Bouvier, Redwood City, CA (US); Dario Clocchiatti, Mountain View, CA (US); Lionel Barrymore Joseph Barrow, Oakland, CA (US); Zachary Michael Beiley, San Francisco, CA (US)

(73) Assignee: INVISAGE TECHNOLOGIES, INC., Newark, CA (US)

( * ) Notice: Subject to any disclaimer, the term of this patent is extended or adjusted under 35 U.S.C. 154(b) by 126 days.

(21) Appl. No.: 14/815,020

(22) Filed: Jul. 31, 2015

(65) Prior Publication Data

US 2016/0037099 A1    Feb. 4, 2016

Related U.S. Application Data

(60) Provisional application No. 62/031,695, filed on Jul. 31, 2014.

(51) Int. Cl.
*H04N 5/363* (2011.01)
*H01L 27/146* (2006.01)

(52) U.S. Cl.
CPC ....... *H04N 5/363* (2013.01); *H01L 27/14612* (2013.01)

(58) Field of Classification Search
CPC .................. H04N 5/363; H01L 27/14612
See application file for complete search history.

(56) References Cited

U.S. PATENT DOCUMENTS

| | | | |
|---|---|---|---|
| 5,648,660 | A | 7/1997 | Lee et al. |
| 5,717,458 | A | 2/1998 | Yonemoto |
| 6,133,862 | A | 10/2000 | Dhuse et al. |
| 6,317,154 | B2 | 11/2001 | Beiley et al. |

(Continued)

FOREIGN PATENT DOCUMENTS

| | | |
|---|---|---|
| WO | 2008131313 A2 | 10/2008 |
| WO | WO-2016019258 A1 | 2/2016 |

OTHER PUBLICATIONS

"International Application Serial No. PCT/US2015/043140, International Search Report dated Dec. 28, 2015", 4 pgs.

(Continued)

*Primary Examiner* — Jason A Flohre
(74) *Attorney, Agent, or Firm* — D. Kligler I.P. Services Ltd.

(57) ABSTRACT

In various embodiments, image sensors and methods of operating the image sensors are disclosed. In an example embodiment, a pixel circuit having a first electrode is coupled to a reset transistor and to a first region of an optically sensitive layer, and a second electrode is coupled to a pixel sense node and to a second region of an optically sensitive layer. The electrical path from the first electrode, through the optically sensitive layer, and into the second electrode functions as a variable resistor. Other devices and methods of operating the devices are disclosed.

17 Claims, 23 Drawing Sheets

(56) References Cited

U.S. PATENT DOCUMENTS

| | | |
|---|---|---|
| 6,493,030 B1 | 12/2002 | Kozlowski et al. |
| 6,911,640 B1 | 6/2005 | Bencuya et al. |
| 7,078,670 B2 | 7/2006 | Atlas et al. |
| 7,561,194 B1 | 7/2009 | Luo et al. |
| 7,773,404 B2 | 8/2010 | Sargent et al. |
| 7,923,801 B2 | 4/2011 | Tian et al. |
| 7,923,802 B2 | 4/2011 | Tian et al. |
| 8,223,234 B2 | 7/2012 | Inuiya et al. |
| 8,736,733 B2 | 5/2014 | Tian et al. |
| 9,451,188 B2 | 9/2016 | Tian et al. |
| 9,456,159 B1 | 9/2016 | Hynecek |
| 9,871,160 B2 | 1/2018 | Tian et al. |
| 2002/0017612 A1 | 2/2002 | Yu et al. |
| 2004/0119853 A1 | 6/2004 | Kokubun et al. |
| 2004/0160522 A1 | 8/2004 | Fossum et al. |
| 2004/0174449 A1 | 9/2004 | Lee et al. |
| 2005/0104089 A1 | 5/2005 | Engelmann et al. |
| 2005/0205879 A1 | 9/2005 | Fukunaga |
| 2005/0248674 A1 | 11/2005 | Mabuchi et al. |
| 2006/0181629 A1 | 8/2006 | Miyashita et al. |
| 2007/0051943 A1 | 3/2007 | Lee et al. |
| 2007/0052055 A1 | 3/2007 | McKee |
| 2007/0076093 A1 | 4/2007 | Misawa |
| 2007/0076108 A1 | 4/2007 | Misawa |
| 2007/0132052 A1 | 6/2007 | Sargent et al. |
| 2007/0228503 A1 | 10/2007 | Yokoyama |
| 2008/0173964 A1 | 7/2008 | Akram |
| 2008/0284884 A1 | 11/2008 | Makino et al. |
| 2009/0027529 A1 | 1/2009 | Jung et al. |
| 2009/0290059 A1 | 11/2009 | Suzuki |
| 2010/0002113 A1 | 1/2010 | Ota |
| 2010/0053386 A1 | 3/2010 | Sizukuisi |
| 2010/0060769 A1 | 3/2010 | Inuiya |
| 2010/0133418 A1* | 6/2010 | Sargent .............. H01L 27/1462 250/208.1 |
| 2010/0140732 A1 | 6/2010 | Eminoglu et al. |
| 2010/0201856 A1 | 8/2010 | Hayashi et al. |
| 2010/0276670 A1 | 11/2010 | Shen et al. |
| 2011/0049665 A1* | 3/2011 | Goto .................... H01L 27/307 257/459 |
| 2011/0069210 A1 | 3/2011 | Ogura et al. |
| 2011/0216212 A1* | 9/2011 | Watanabe ............ H04N 5/2353 348/222.1 |
| 2011/0228144 A1 | 9/2011 | Tian et al. |
| 2012/0074297 A1 | 3/2012 | Yonekura et al. |
| 2012/0173175 A1 | 7/2012 | Devicharan et al. |
| 2012/0200752 A1* | 8/2012 | Matsunaga .......... H04N 5/3559 348/300 |
| 2012/0268635 A1 | 10/2012 | Furuta et al. |
| 2013/0075593 A1 | 3/2013 | Williams et al. |
| 2013/0208157 A1 | 8/2013 | Bechtel et al. |
| 2013/0277536 A1* | 10/2013 | Mizuno ................ H04N 5/3535 250/208.1 |
| 2014/0054466 A1* | 2/2014 | Kurokawa ........... H04N 5/3745 250/362 |
| 2014/0131554 A1* | 5/2014 | Ishii ...................... H04N 5/363 250/208.1 |
| 2014/0146211 A1* | 5/2014 | Mori ................... H04N 5/3575 348/308 |
| 2014/0175591 A1 | 6/2014 | Tian et al. |
| 2014/0284663 A1 | 9/2014 | Meinhold et al. |
| 2014/0313386 A1 | 10/2014 | Jiang et al. |
| 2014/0362263 A1* | 12/2014 | Boisvert ............... H04N 5/363 348/294 |
| 2015/0015747 A1 | 1/2015 | Hizi |
| 2015/0015759 A1 | 1/2015 | Kavakan et al. |
| 2015/0070544 A1 | 3/2015 | Smith et al. |
| 2015/0304582 A1 | 10/2015 | Hirota |
| 2015/0319386 A1 | 11/2015 | Brady et al. |
| 2015/0357360 A1 | 12/2015 | Tian et al. |
| 2016/0037070 A1 | 2/2016 | Mandelli et al. |
| 2016/0037114 A1 | 4/2016 | Mandelli et al. |
| 2016/0155882 A1 | 6/2016 | Tian et al. |
| 2017/0013218 A1 | 1/2017 | Tian et al. |
| 2017/0054928 A1 | 2/2017 | Boisvert et al. |
| 2017/0201693 A1 | 7/2017 | Sugizaki et al. |
| 2017/0208273 A1 | 7/2017 | Mandelli et al. |
| 2017/0264836 A1 | 9/2017 | Mandelli et al. |

OTHER PUBLICATIONS

"International Application Serial No. PCT/US2015/043140, Invitation to Pay Add'l Fees and Partial Search Rpt dated Oct. 1, 2015", 2 pgs.

"International Application Serial No. PCT/US2015/043140, Written Opinion dated Dec. 28, 2015", 4 pgs.

International Application # PCT/US2017/043410 search report dated Dec. 1, 2017.

U.S. Appl. No. 15/269,659 office action dated Dec. 12, 2017.

International Application # PCT/US2017/057090 search report dated Jan. 12, 2018.

International Application # PCT/US2017/057093 search report dated Jan. 16, 2018.

Pain et al., "Reset Noise Suppression in Two-Dimensional CMOS Photodiode Pixels through Column-based Feedback-Reset", International Electron Devices Meeting, San Fransisco, Session 32.5, 4 pages,Dec. 8-11, 2002.

International Application # PCT/US17/57094 search report dated Jan. 17, 2018.

Fowler et al., "Low Noise Readout using Active Reset for CMOS APS", Proceedings SPIE, vol. 3965, 10 pages, year 2000.

Kozlowski et al., "Pixel Noise Suppression via SoC Management of Tapered Reset in a 1920x1080 CMOS Image Sensor", IEEE Journal of Solid-State Circuits, vol. 40, 42 pages, Jan. 2006.

Ishii et al., "An Ultra-low Noise Photoconductive Film Image Sensor With a High-speed Column Feedback Amplifier Noise Canceller", Dig. VLSI Circuits, pp. C8-C9, Jun. 2013.

Kapusta et al., "Sampling Circuits That Break the kT/C Thermal Noise Limit", IEEE Journal of Solid-State Circuits, vol. 49, No. 8, pp. 1694-1701, Aug. 2014.

U.S. Appl. No. 15/269,659 office action dated Jun. 18, 2018.

* cited by examiner

US 10,104,322 B2

IMAGE SENSORS WITH NOISE REDUCTION

PRIORITY CLAIM

The present application claims the benefit of priority of U.S. Provisional Patent Application Ser. No. 62/031,695, filed Jul. 31, 2014, entitled "IMAGE SENSORS WITH NOISE REDUCTION," which is incorporated herein by reference in its entirety.

TECHNICAL FIELD

The present application relates generally to the field of optical and electronic systems and methods, and methods of making and using the devices and systems.

BACKGROUND

Image sensor noise is comprised of fixed pattern noise (FPN) or temporal noise. FPN can be mitigated via offset and gain correction schemes. This, however, is not true for temporal noise. Once introduced, it remains in the image. Hence, temporal noise reduction techniques are required.

A major contributor of temporal noise in 3T pixels is reset noise with a noise power on the order of kT/C, where C is the capacitance at the sense node of the pixel. Reset noise results from random fluctuations in voltage at the sense node due to intrinsic noise in the reset transistor. These fluctuations are frozen on the sense node when the respective capacitance is disconnected from reset device. Reset noise can be suppressed by reducing the amount of these fluctuations. Below describes a method to reduce this component.

The noise reduction technique makes use of a column feedback amplifier and a tapered reset signal. The fluctuations on the sense node are reduced by sensing the variations instantaneously and adjusting the drain current by modulating gate of the reset transistor. The reset signal modulates the amplifier loop traversing hard reset and soft reset resulting in a noise power that is reduced by the open loop gain of the amplifier, i.e. kT/AC (where A is the amplifier gain), with low lag.

Moreover new techniques can be implemented if a photo-sensitive material, i.e. quantum film, is used instead of an integrated silicon photodiode, as the sense node is comprised of the electrical and silicon parasitic capacitance as well as the photosensitive material capacitance.

BRIEF DESCRIPTION OF THE DRAWINGS

FIG. 16 shows an embodiment of a single-plane computing device that may be used in computing, communication, gaming, interfacing, and so on;

FIG. 17 shows an embodiment of a double-plane computing device that may be used in computing, communication, gaming, interfacing, and so on;

DETAILED DESCRIPTION

Figure 1:
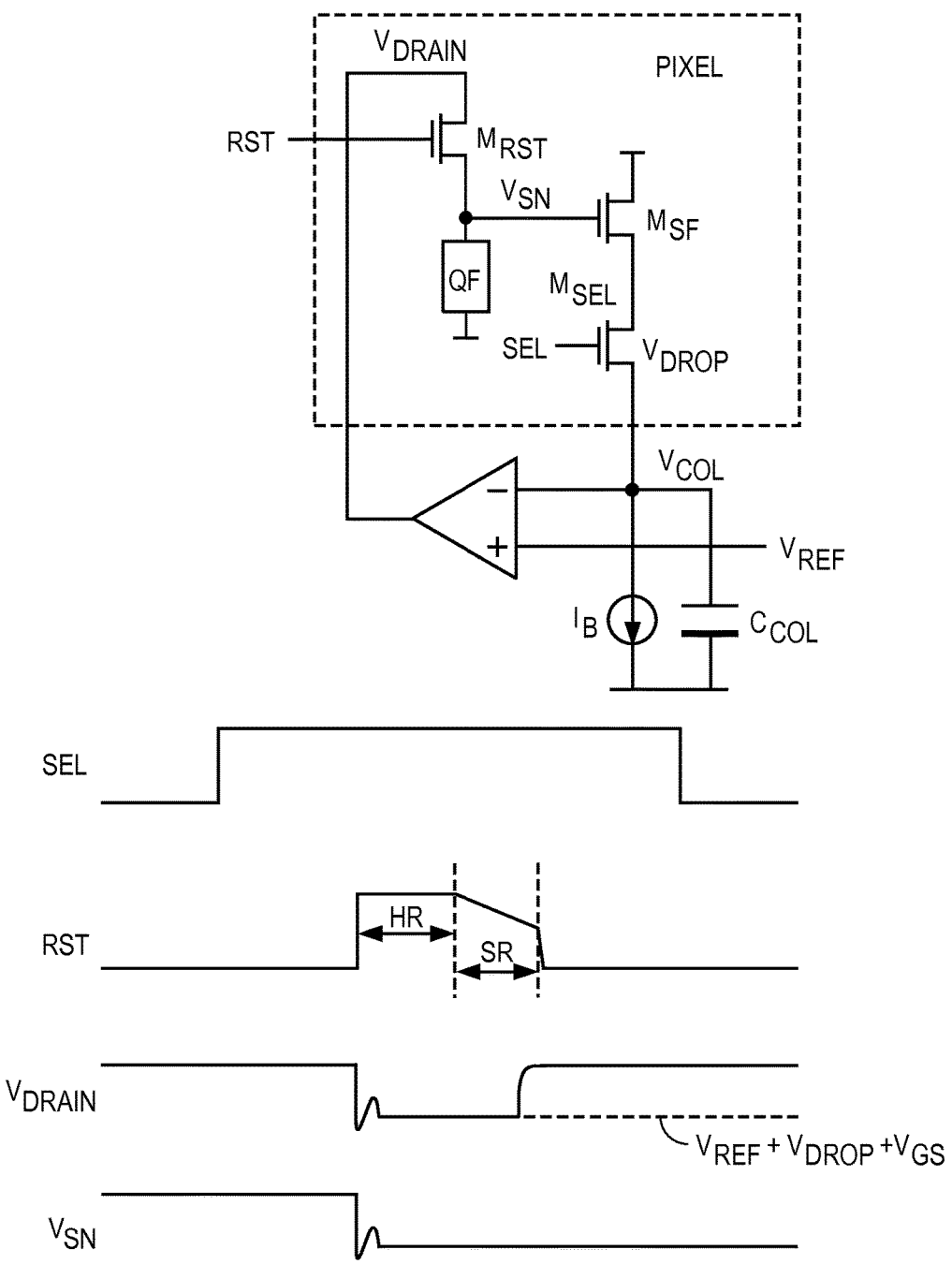
FIG. 1 shows an example embodiment of a reset noise reduction circuit.

Various embodiments of the disclosed subject matter describe image sensors with noise reduction. For example, FIG. 1 shows an example embodiment of a reset noise reduction circuit. As shown in FIG. 1, RST represents a signal applied to the gate of transistor $M_{RST}$, which shall be referred to as the reset transistor. The drain is connected to the output of a column feedback amplifier. Replacing the typical photo-conversion element is Quantum Film (QF). The source of $M_{RST}$ is connected to the QF element and the input gate of source follower device, $M_{SF}$.

$V_{DRAIN}$ is the voltage which regulates the amplifier loop thereby making $V_{COL}$ equal to $V_{REF}$. The following expression describes $V_{DRAIN}$:

$$V_{DRAIN} \approx V_{REF} + V_{DROP} + V_{GS}(M_{RST}) \quad (1)$$

As an example, for a 110 nm CMOS Image Sensor process a typical value for $V_{DRAIN}$ is about 0.8 V to about 1.5 V with active feedback.

$V_{SN}$ is the voltage of the sense node which is also the source of the aforementioned transistor $M_{RST}$. While the feedback loop is active, $V_{SN} \approx V_{DRAIN}$.

Figure 2:
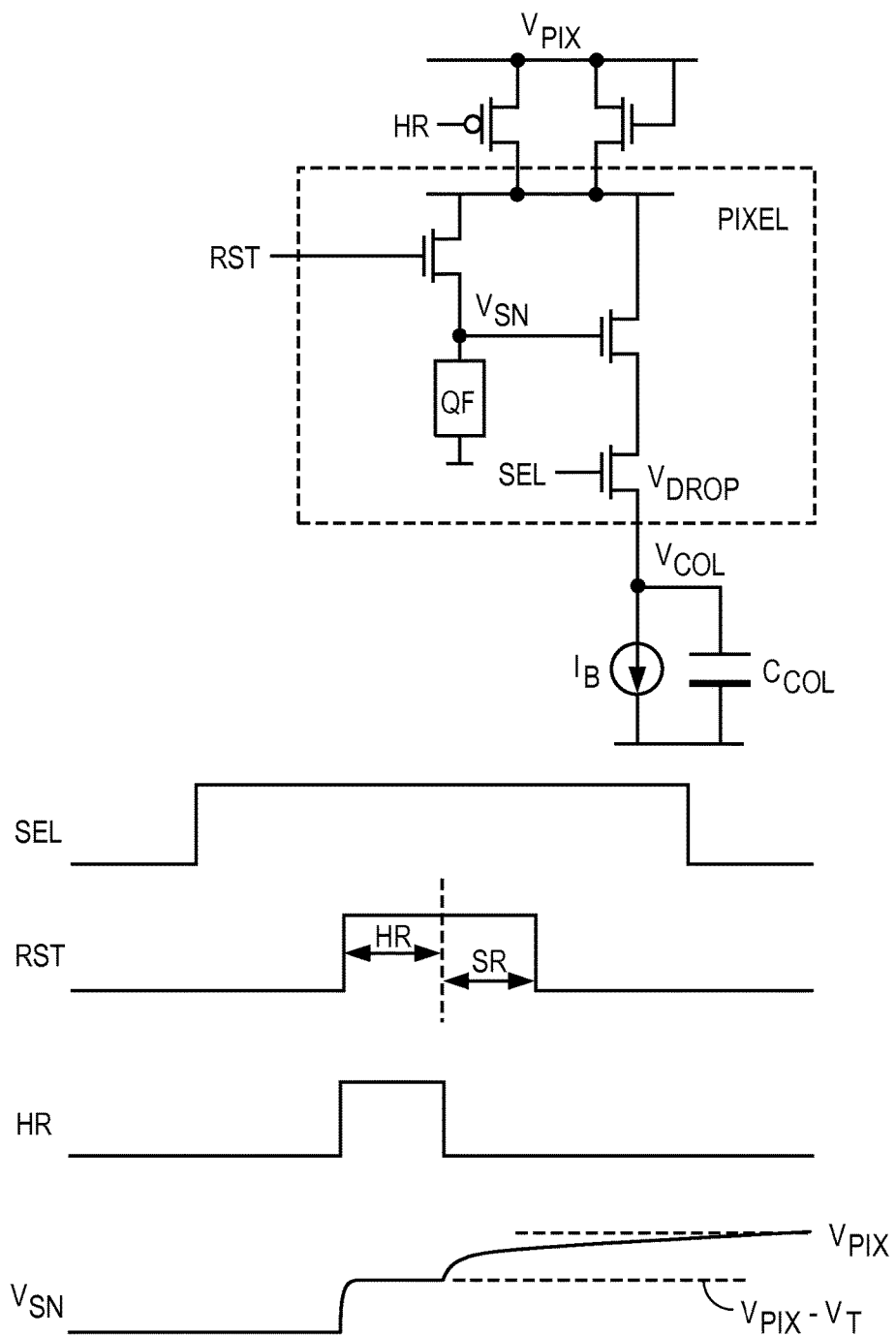
FIG. 2 shows an example embodiment of a reset noise circuit.

Normally, in the absence of the feedback-based reset scheme described herein, the timing of the circuit functions as follows. Referring to an example embodiment of a reset noise circuit of FIG. 2, as RST and HR (hard reset) are high, $V_{SN}$ is reset to approximately 1.6 V. As HR goes low, a soft reset (SR) is entered and $V_{SN}$ slowly moves toward the pixel supply voltage ($V_{PIX}$). Using HR/SR reduces noise power from kT/C to approximately kT/2C. In the dark $V_{SN}$ integrates down at a rate determined by the dark current. Ideally, this is a small value of about 10 electrons/s, which for a conversion gain of 88 μV/e⁻, corresponds to a rate of approximately 0.8 mV/s. A conversion gain of 88 μV/e⁻ would result in 16e⁻ of noise.

With the feedback-based implementation, as the pixel is selected (SEL is high) a reset signal is applied (RST). The RST is comprised of three areas of operation—hard reset (HR), soft reset (SR), and off (freeze). During HR phase $V_{SN}$ is reset to approximately 1.8V. HR of the pixel removes image lag. As RST is tapered, the system inters into the SR phase. Through HR/SR the high gain amplifier adjusts $V_{DRAIN}$ to create a virtual ground at the inputs of the amplifier by making $V_{COL} = V_{REF} = 1.4$ V. In the process, the high gain negative feedback compensates for any fluctuations at the sense node, resetting $V_{SN}$ with a noise power less than kT/C. The pixel does not reach equilibrium but is held in SR mode under continuous feedback. When RST is low, the noise at the sense node is frozen. A conversion gain of 88 μV/e⁻ and open loop gain of 1000 V/V will result in less than 10e⁻ of noise.

To reduce row time the RST time slot should be as small as possible. The time slot should be distributed such that the SR portion is as large as possible, as this is the time when the noise reduction takes place. The HR time will be determined by the loop response as $V_{COL}$ reaches $V_{REF}$ within a desired level of accuracy. As you move through SR, the resistance of the RST device increases (that is, modulated bandwidth) and ultimately opens the loop and thereby freezes a voltage at the sense node ($V_{SN}$). $V_{COL}$ will be a level-shifted version of this reduced noise $V_{SN}$. In one example, less than 3.5 μs is required for 10e⁻ of noise.

Figure 3:
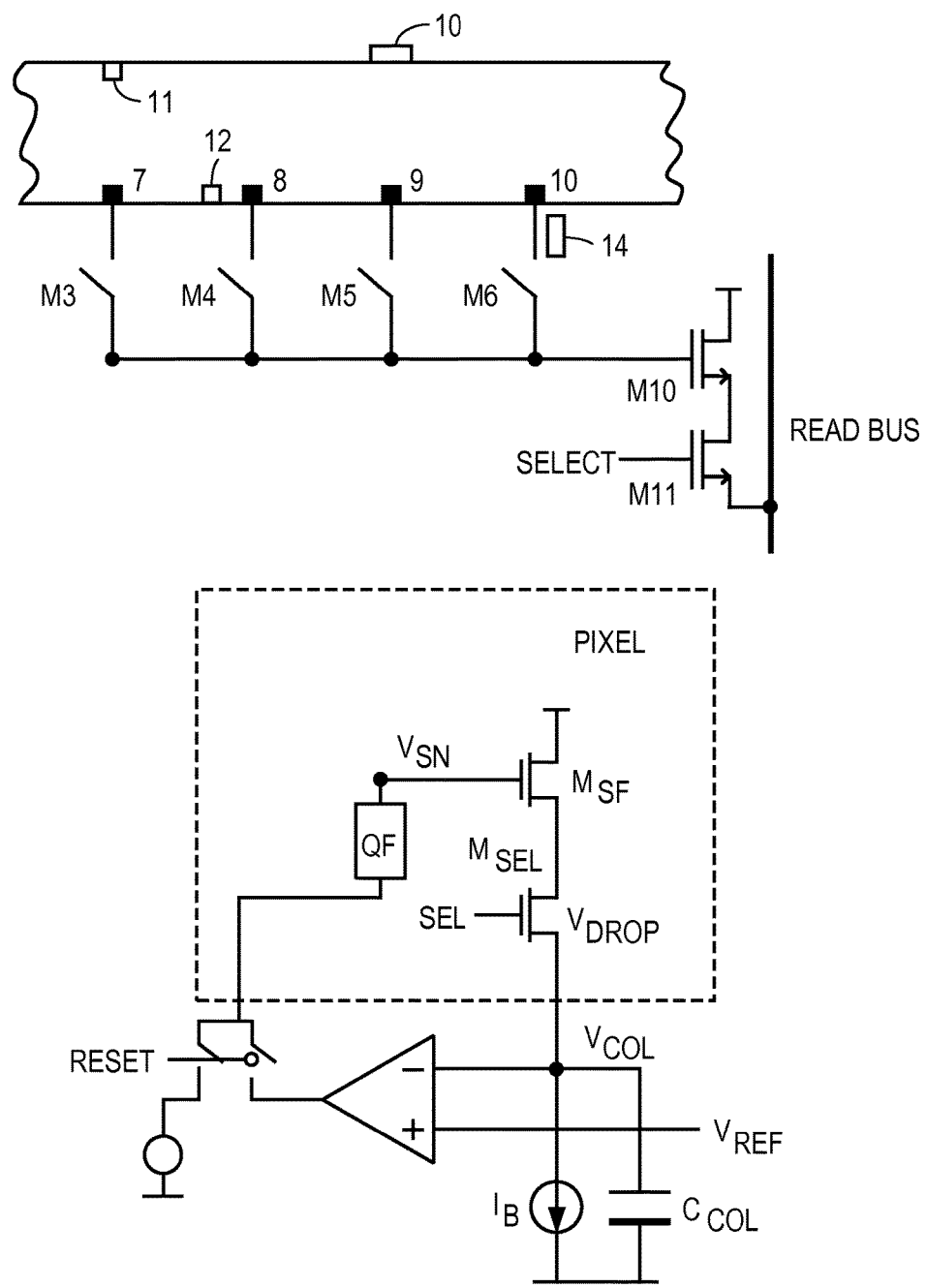
FIG. 3 shows an example embodiment of a film noise circuit including a cross section of a reset methodology that uses an electrode instead of a reset transistor.

In embodiments, the reset of the sense node is not implemented with a silicon transistor device but uses a dedicated photosensitive material electrode to flush the charge out. FIG. 3 shows a cross section of a reset methodology that uses an electrode instead of a reset transistor. In this implementation, the second photo-sensitive material electrode, which would normally be biased to a constant DC voltage, is, instead, during the reset phase, driven by the feedback amplifier, and provides an electrical path to close the loop and enable the noise lowering technique.

Figure 4:
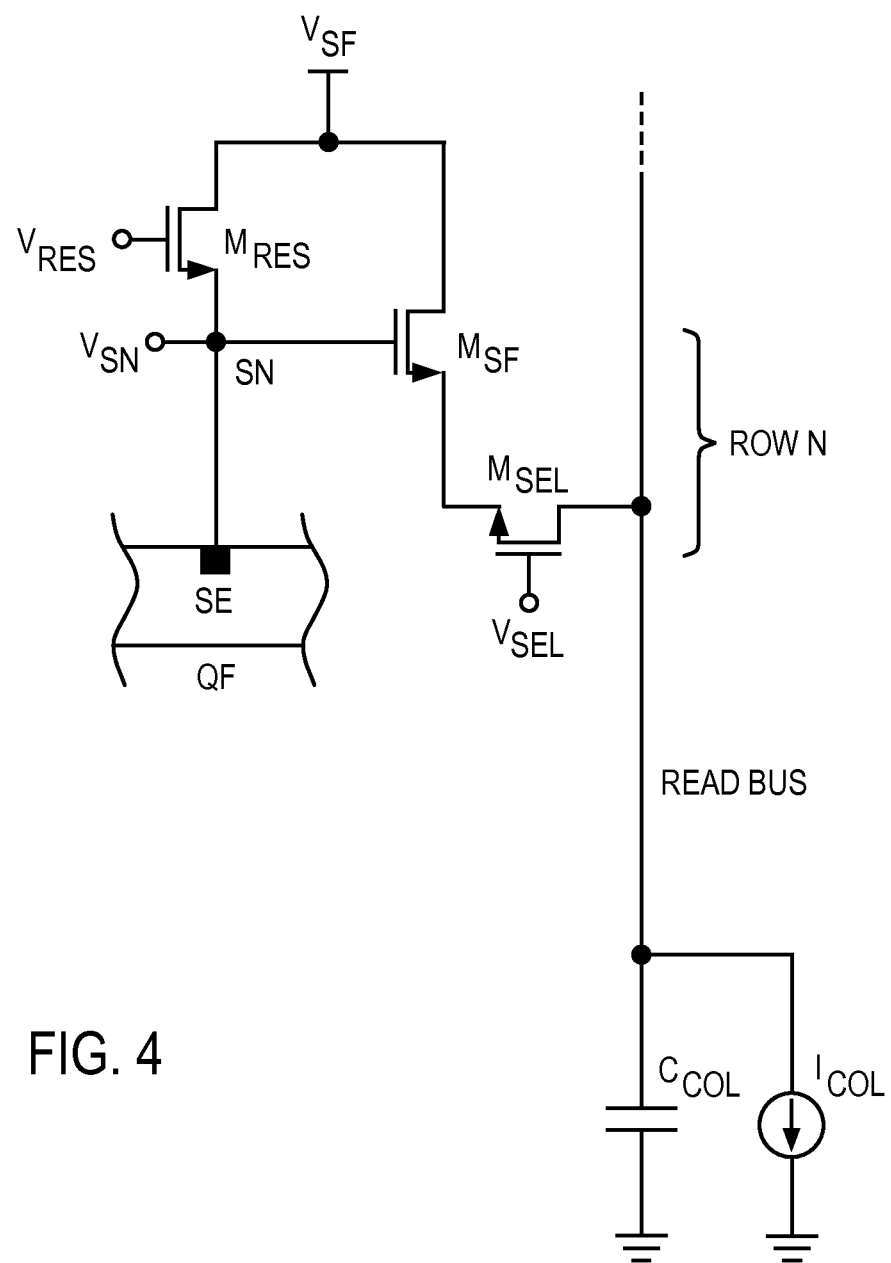
FIG. 4 shows an example embodiment of a 3T pixel architecture.

FIG. 4 shows how an optically sensitive layer can be employed as a light sensitive device when integrated with a 3T pixel architecture. In FIG. 4, the sense-node electrode (SE) is in electrical communication with the sense node (SN). Incoming photons induce the generation of carriers within the optically sensitive material. In embodiments, the optically sensitive layer may comprise, for example, quantum dots, organics, polymers, bulk solution-processed semiconductors, bulk crystalline semiconductors such as crystalline silicon, or nanowires, nanoplates, or quantum dots.

Photocarriers are collected at the sense-node electrode as it is left floating during the integration period. This causes the potential of the sense node to change at a rate proportional to the light intensity. When the optically sensitive material is integrated in a 3T pixel architecture, a major contributor of temporal noise is Johnson-Nyquist noise. Johnson-Nyquist noise is due to the thermal fluctuations of charge carriers within the reset transistor channel during the reset operation of the sense node. It causes the reset level to be different from reset to reset, for example, from frame to frame in an image sensor. The noise power of the reset operation is on the order of kT/C, where C is the capacitance of the sense node.

In order to reset the sense node, an electrical connection between the sense node and a regulating power supply is typically established. This is traditionally achieved via a reset transistor ($M_{RES}$) located in the pixel pitch (see FIG. 4).

Alternative approaches can be used to achieve this electrical connection. Desirably, in such approaches, the resistive properties between sense node and regulating supply can toggle between very high resistivity (open circuit) to very high conductivity (closed circuit).

In embodiments of the disclosed subject matter, the controllably-varied (toggled) connection is achieved, and regulated, within the optically sensitive layer. Embodiments of an optically sensitive layer include one comprised of quantum dots. In embodiments, the optically sensitive layer operates as a nonlinear light-sensitive device whose resistance depends on the voltage bias across two electrodes.

Figure 5:
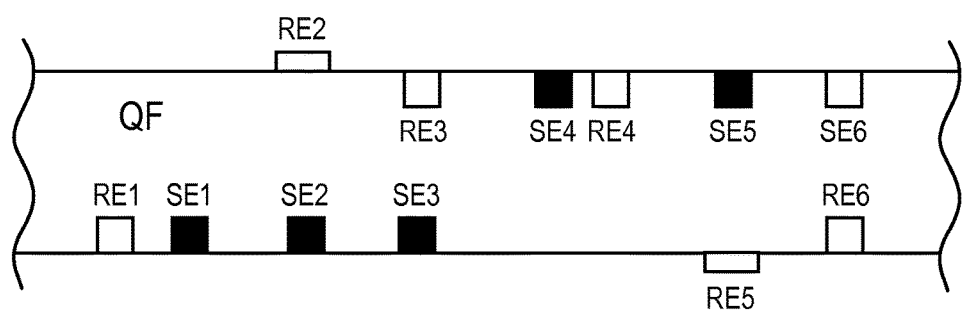
FIG. 5 shows an example embodiment of six different reset electrode (RE) positioning options in an optically sensitive layer stack.

FIG. 5 shows example configurations of electrodes pairs that may be employed in the regulation of the conductance of the connection referred to above. In an embodiment, FIG. 5 shows an example of six different reset electrode (RE) positioning options in an optically sensitive layer stack.

With continuing reference to FIG. 5, SE stands for Sense-node Electrode while RE stands for Reset Electrode. These two electrodes can rely on a number of possible layouts, materials, fabrication techniques, and properties. By controlling the bias voltage across these two electrodes, the optically sensitive layer can be operated in different regimes. In particular, the optically sensitive layer may be designed to behave as a nonlinear resistor device, one that exhibits high conductivity (e.g., kΩ–MΩ–GΩ) at high bias voltage (e.g., about 2 V to about 3 V), and that exhibits high resistivity (e.g., approximately $10^{12}Ω$ to $10^{18}Ω$) at a small bias voltage (e.g., about 0 V to about 1 V).

The resistance between any two electrodes contacting the optically sensitive layer can be tuned by adjusting the bias between the two electrodes. The optically sensitive layer can be a semiconductor device, similar to a pn-junction, such that its current-voltage behavior is highly nonlinear. With low to moderate biasing in one polarity (called "reverse bias" here), the optically sensitive layer resistance can be in the range of approximately $10^{12}Ω\text{-}μm^2$ to $10^{18}Ω\text{-}μm^2$. When biased in the opposite polarity (called "forward bias" here), the optically sensitive layer resistance can be in the range of approximately $10^{3}Ω\text{-}μm^2$ to $10^{9}Ω\text{-}μm^2$, with an exponential bias dependence so that the optically sensitive layer resistance drops dramatically with increasingly larger forward biases.

Figure 6:
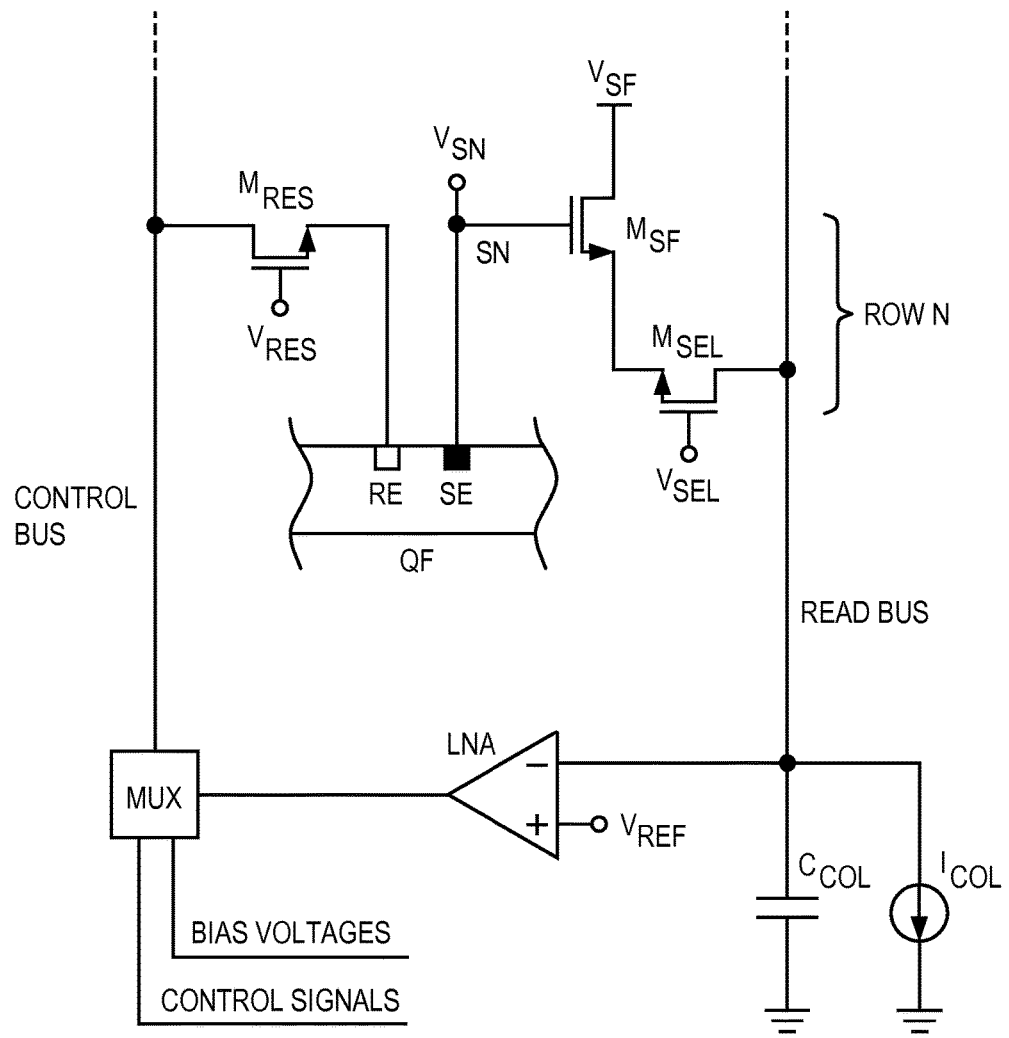
FIG. 6 shows an example embodiment of a pixel architecture for an optically sensitive layer reset and noise reduction circuit.

Noise reduction techniques can make use of a feedback amplifier (e.g., a Low Noise Amplifier, LNA) and a device to modulate the pixel noise bandwidth. The fluctuations on the sense node are reduced by sensing the READBUS (see FIG. 6) variations at the input of the amplifier that will adjust its output to modulate the sense node voltage and correct for the noise fluctuations. Typically the amplifier compensates for noise fluctuations that are present on its input lines (i.e., that have not been filtered out by the bandwidth of the feedback loop). Therefore, to ensure maximum noise reduction, the bandwidth of the pixel noise fluctuations needs to be lower than the bandwidth of the feedback loop ($BW_{noise} < BW_{feedback}$). The pixel bandwidth on the sense node can be controlled by connecting a nonlinear resistor device to the sense node. Its resistance will determine the final bandwidth of the sense node. In particular a higher resistance will yield lower pixel bandwidth.

One way to modulate the bandwidth of the sense node is by using the optically sensitive layer as a variable resistor. The resistance of the optically sensitive layer can be tuned by the proper choice of biasing, so that it can provide the approximately 1 kΩ to 10 kΩ used during the reset phase, the approximately 1 GΩ to 10 GΩ (giga-Ohm) used during a variable high resistance state, and the greater than approximately $10^{16}$Ω used during the "off" state.

A resistance of approximately 1 kΩ to 10 kΩ can be achieved with a forward bias of approximately 1 V to 2 V, a resistance of approximately 1 GΩ to 10 GΩ (giga-Ohm) can be achieved with a forward bias of approximately 0.1 V to 1 V, and a resistance of greater than approximately $10^{16}$Ω can be achieved with a reverse bias of approximately 1 V to 3 V.

The resistance of the optically sensitive layer can be adjusted through control of the pixel geometry. Increasing the separation of the pixel electrode and reset electrodes to the optically sensitive layer will increase the optically sensitive layer resistance, while increasing the area of each electrode will reduce the optically sensitive layer resistance. The optically sensitive layer resistance can also be controlled by changes to the device architecture of the optically sensitive layer device stack, including choices of electrode materials, interfacial layers, and composition and processing of the optically sensitive layer. These choices can modulate the rate of current injection from the electrodes, as well as the transport and recombination processes in the optically sensitive layer, all of which affect the voltage-dependent resistance of the optically sensitive layer.

Figure 8:
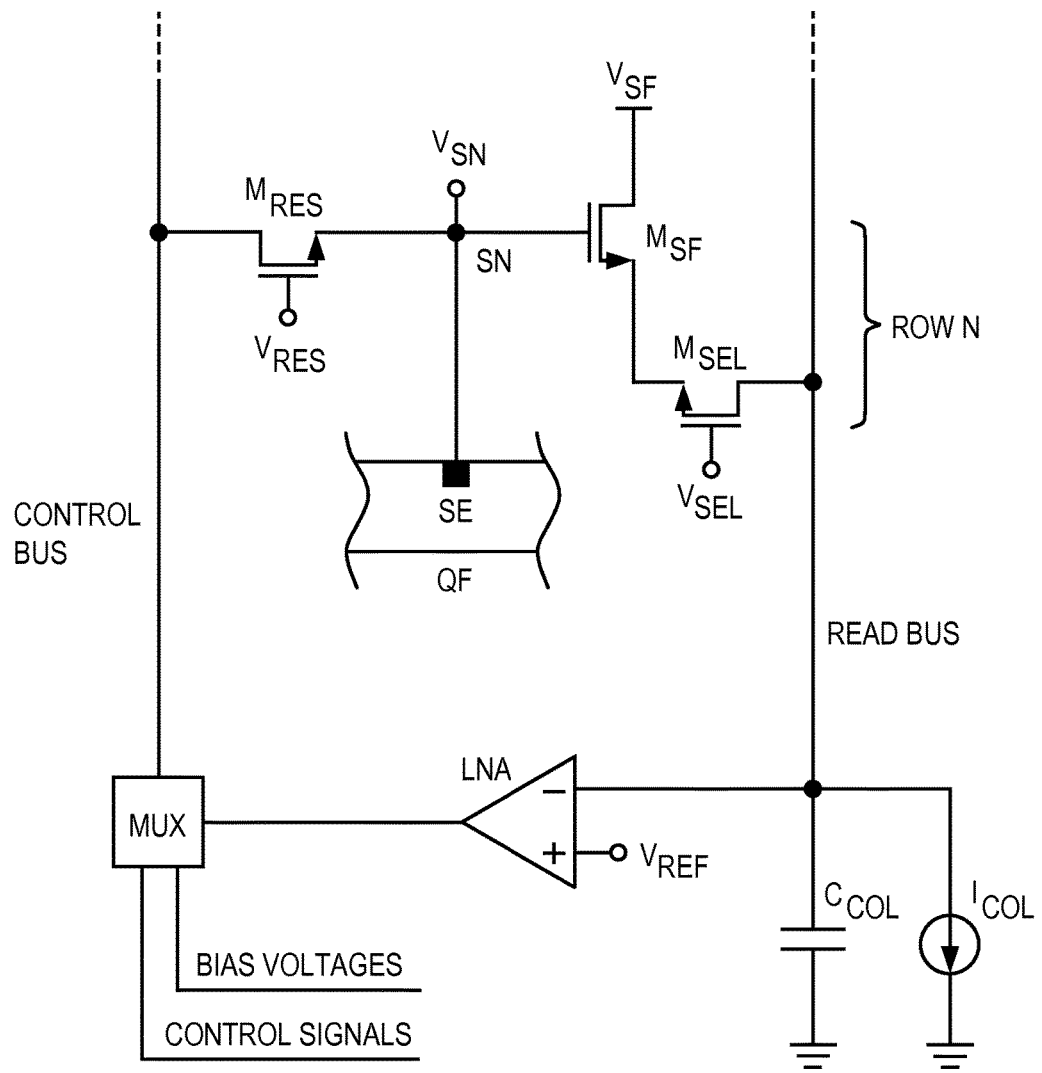
FIG. 8 shows an example embodiment of a pixel architecture for noise reduction using a reset transistor MRES.
Figure 10:
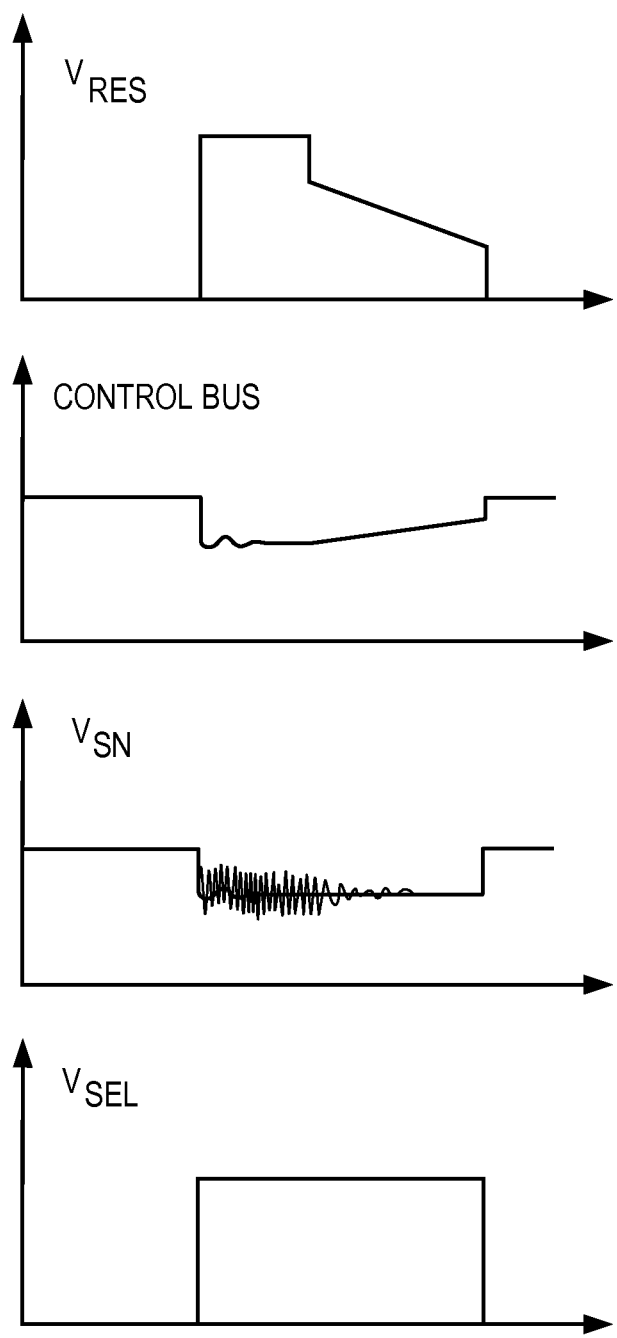
FIG. 10 shows an example embodiment of a timing diagram for a noise reduction pixel architecture using a reset transistor MRES that may be used with the circuits of FIGS. 8 and 9.

In embodiments, it is possible to use a MOS transistor to reset the SN, whose channel resistance is changed by varying the potential on the gate of the transistor (see FIG. 8). An example timing sequence for this pixel architecture is shown in FIG. 10.

Figure 9:
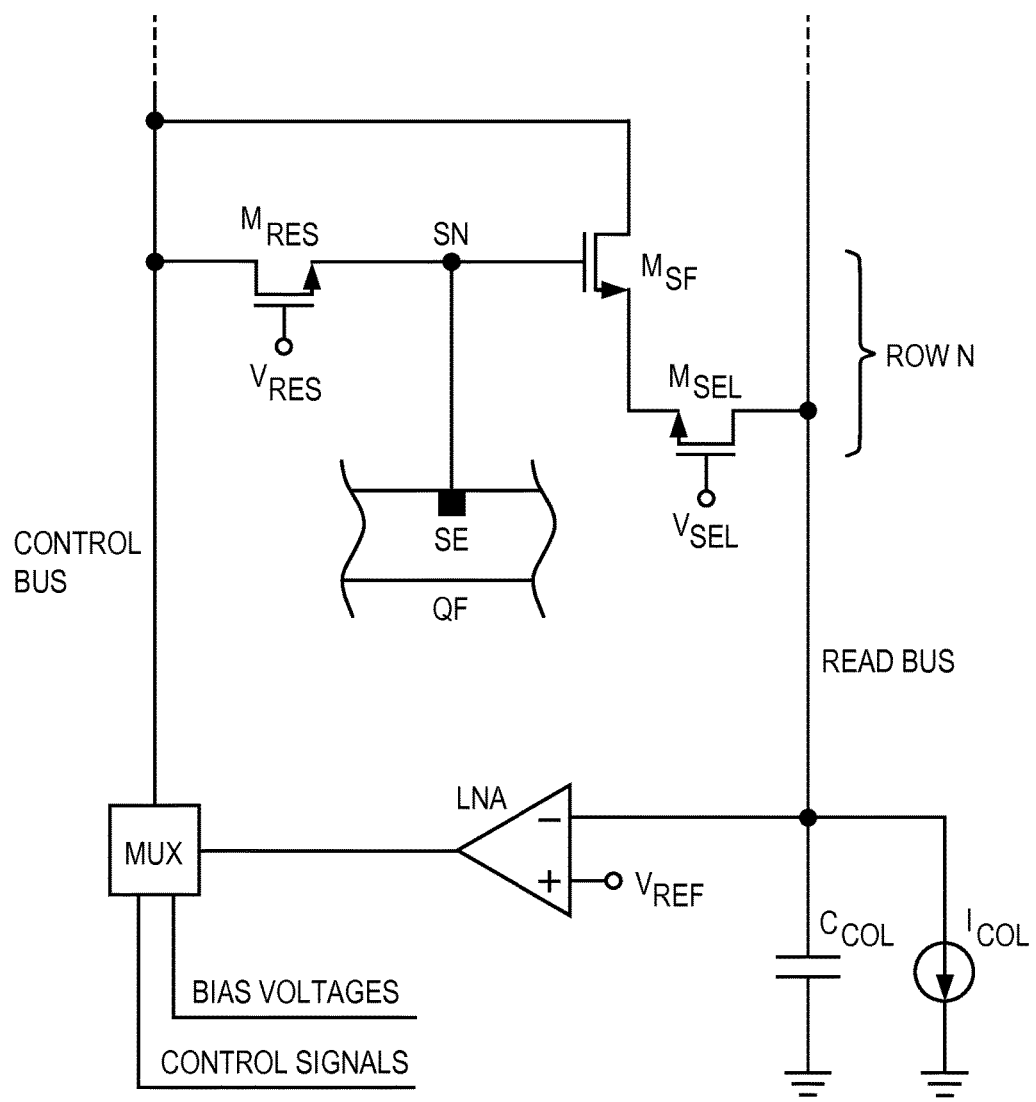
FIG. 9 shows an example embodiment of a pixel architecture for noise reduction using a reset transistor MRES with the drains of the reset (MRES) and source follower (MSF) being electrically coupled.

In embodiments, the drain of the reset MOS device can be shared with the drain of the source follower device (see FIG. 9). The operation of this pixel architecture is similar to that described in FIGS. 8 and 10; however, it removes the need for an additional metal line connection into the pixel (the transistor $M_{SF}$ being now driven by CONTROL BUS), thus enabling a smaller pixel pitch.

When the reset element is in low resistance mode, the sense node is fast, and the noise therefore has a high frequency bandwidth. However, since the column node is generally very slow, the full spectrum of the noise on the sense node cannot be seen at the terminals of the LNA because it is being filtered. In this condition, the LNA typically does not fully compensate for the entire spectrum of noise at the SN. To overcome this limitation, the bandwidth on the SN is lowered below the bandwidth of the column by putting the variable reset resistor in high resistance mode. The LNA is now able to compensate more fully for the noise on the sense node.

Figure 7:
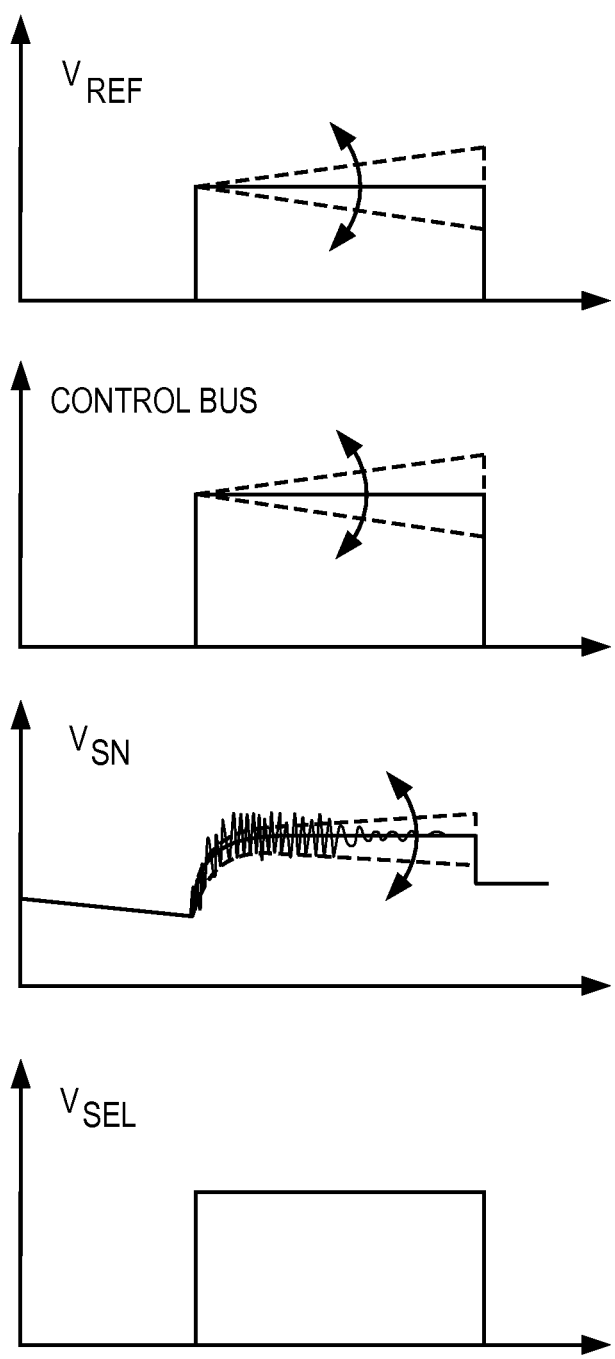
FIG. 7 shows an example embodiment of a timing diagram for an optically sensitive layer reset and noise reduction circuit that may be used with the circuit of FIG. 6.

Referring again to FIG. 6, an example pixel architecture is shown that can achieve both pixel reset through the optically sensitive layer and noise reduction operations. As already described, for a more complete noise reduction operation, the reset device desirably transitions through three regimes: a low resistance state, a variable high resistance, and an extremely high resistance essentially behaving like an 'off' state for the device. An example timing diagram for a pixel operation sequence for this architecture is shown in FIG. 7. At the end of the Integration Phase, the Sense Node voltage will depend on the amount of charge that has been accumulated on the Sense-node electrode SE. The reset of the Sense Node starts when the reset switch $M_{RES}$ is closed therefore connecting the reset electrode to the CONTROL BUS. The CONTROL BUS is always the result of a proper operation of a column multiplexer (MUX) that can toggle its output between a feedback amplifier LNA and other fixed bias voltages. At the beginning of the reset phase, the CONTROL BUS is chosen so that the optically sensitive layer is driven in the low resistance state which will remove (flush) the charges accumulated on the Sense Node and thereby minimize or reduce lag (which in imaging corresponds to image lag). This can be achieved either via the feedback amplifier LNA or a fixed bias voltage.

After this initial phase, the feedback loop is engaged and the amplifier modulates its output to compensate for any voltage fluctuations at the Sense Node that is not filtered out by the bandwidth of the feedback loop. In order to ensure maximum noise reduction, the bandwidth of the pixel noise fluctuations is lowered below the bandwidth of the feedback loop ($BW_{noise} < BW_{feedback}$). In this implementation of the pixel, the bandwidth lowering at the Sense Node is achieved thanks to the nonlinear resistive region of the optically sensitive layer. The voltage $V_{REF}$ can be actively modulated in this phase to provide a way to effectively regulate/program/determine the reset operation. A sufficient interval of time should desirably be spent in this regime to allow full noise reduction of all pixels and $V_{REF}$ modulation can be used to ensure this is happening. The last stage of the reset turns off the electrical connection between the reset electrode and the sense node by first setting the reset electrode to a suitable potential (which is low enough to repel charges from the reset electrode and push them toward the Sense Node) and then turn off the reset switch $M_{RES}$. The integration phase starts when the reset switch is finally turned off.

In embodiments, the capacitance of the optically sensitive layer can be reduced to increase the signal to noise ratio, as the signal to noise ratio is proportional of 1/sqrt(C). The capacitance of the optically sensitive layer can depend on several factors. In embodiments, the capacitance of the optically sensitive layer can be rendered lower when the optically sensitive layer is fully depleted of free electrons and holes at all operating potentials. The doping density required to fully deplete the optically sensitive layer depends on the details of the optically sensitive layer geometry and dielectric constant, as well as the bias across the optically sensitive layer. In general, a lower doping density will make it easier to fully deplete. In an example embodiment in which the optically sensitive is a uniform thin film approximately 0.5 μm in thickness, and having a dielectric constant of 10∈$_0$ (i.e., a relative dielectric constant of approximately 10), the optically sensitive layer can be fully depleted with a greater than about 1 V bias across it if the doping density (either n-type or p-type) is less than approximately $1 \times 10^{16}$ cm$^{-3}$.

In embodiments where the doping density of the optically sensitive layer is sufficiently low such than the optically sensitive layer is fully depleted, the capacitance of the optically sensitive layer can further be reduced by the adjustment of several properties of the optically sensitive layer. In embodiments where the optically sensitive layer is a thin film of uniform thickness, the capacitance can be lower when the optically sensitive layer is thicker. The capacitance of the optically sensitive layer can be lower if its dielectric constant is lower. The dielectric constant is a material property of the optically sensitive layer depending on its chemical constituents and density.

Embodiments of the invention include a pixel circuit having a first electrode coupled to a reset transistor and to a first region of an optically sensitive layer, and a second electrode coupled to a pixel sense node and to a second region of an optically sensitive layer. The electrical path from the first electrode, through the optically sensitive layer, and into the second electrode functions as a variable resistor.

Embodiments include the pixel circuit where, in a first mode, the variable resistor exhibits a resistance less than $10^9$ ohms.

Embodiments include the pixel circuit where, in a second mode, the variable resistor exhibits a resistance exceeding $10^{16}$ ohms.

Embodiments include the pixel circuit where, in the first mode, the sense node is reset to a potential determined by the reset transistor.

Embodiments include the pixel circuit where, in the second mode, the sense node potential changes at a rate related to the optical signal illuminating the optically sensitive layer.

Embodiments include the pixel circuit where, in a third mode, the first electrode is electrically coupled to the output of a feedback amplifier.

Embodiments include the pixel circuit where the feedback amplifier imposes a voltage on the sense node that is specified to within a noise power that is appreciably lesser than kT/C.

Embodiments include the pixel circuit where, in the second mode, the optically sensitive layer is substantially fully depleted of free carriers.

Embodiments include the pixel circuit where the optically sensitive layer is sensitive to any one or more of the infrared, visible and ultraviolet regions of the electromagnetic spectrum.

Embodiments include the pixel circuit where the optically sensitive layer includes one or more types of quantum dot nanocrystals.

Embodiments include the pixel circuit where at least two the quantum dot nanocrystals are at least partially fused.

Embodiments include the pixel circuit where the optically sensitive layer includes a combination at least two types of quantum dots, each including a distinct semiconductor material and/or having distinct properties.

Embodiments include the pixel circuit where the optically sensitive layer includes an optically sensitive semiconducting polymer from the list including {MEH-PPV, P3OT and P3HT}.

Embodiments include the pixel circuit where the optically sensitive layer includes a polymer-quantum dot mixture having one or more types of quantum dots sensitive to different parts of the electromagnetic spectrum.

In embodiments, a pixel circuit includes a reset transistor having a gate, a source, and a drain; and an optically sensitive material to couple to a first electrode and a second electrode, with the first electrode being in electrical communication with the source. During a first, hard reset interval, a residual of prior integration periods is reset, and during a second, feedback-based soft reset interval, an electrical potential is set to a level that is defined to within a noise power that is appreciably less than kT/C.

In embodiments, a pixel circuit includes an optically sensitive layer having a first electrode and a second electrode, with the first electrode being in electrical communication with a switch. In a integration period mode, the switch is configured to provide a DC bias to the optically sensitive layer, and during a feedback-reset period mode, the switch is configured to couple to a feedback reset device. The feedback reset device is configured to impose a reset to a defined reset voltage level that is specified to within a noise power that is appreciably less than kT/C.

Figure 11:
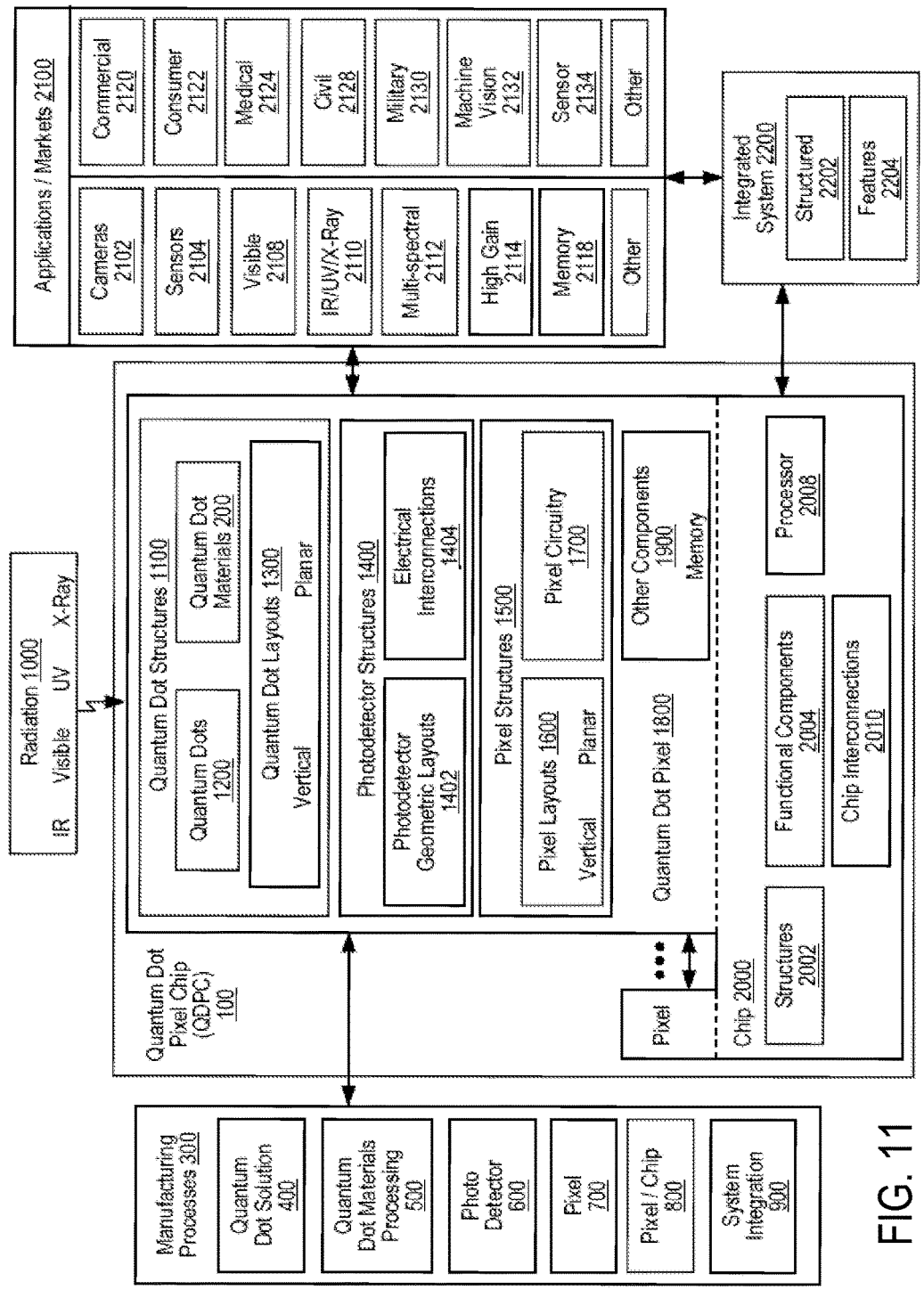
FIG. 11 shows overall structure and areas related to a quantum dot pixel chip, according to an embodiment.

Referring now to FIG. 11, additional example embodiments provide image sensing regions that use an array of pixel elements to detect an image. The pixel elements may include photosensitive material. The image sensor may detect a signal from the photosensitive material in each of the pixel regions that varies based on the intensity of light incident on the photosensitive material. In one example embodiment, the photosensitive material is a continuous film of interconnected nanoparticles. Electrodes are used to apply a bias across each pixel area. Pixel circuitry is used to integrate a signal in a charge store over a period of time for each pixel region. The circuit stores an electrical signal proportional to the intensity of light incident on the optically sensitive layer during the integration period. The electrical signal can then be read from the pixel circuitry and processed to construct a digital image corresponding to the light incident on the array of pixel elements. In example embodiments, the pixel circuitry may be formed on an integrated circuit device below the photosensitive material. For example, a nanocrystal photosensitive material may be layered over a CMOS integrated circuit device to form an image sensor. Metal contact layers from the CMOS integrated circuit may be electrically connected to the electrodes that provide a bias across the pixel regions. U.S. patent application Ser. No. 12/10,625, titled "Materials, Systems and Methods for Optoelectronic Devices," filed Apr. 18, 2008 (Publication No. 2009/0152664) includes additional descriptions of optoelectronic devices, systems and materials that may be used in connection with example embodiments and is hereby incorporated herein by reference in its entirety. This is an example embodiment only and other embodiments may use different photodetectors and photosensitive materials. For example, embodiments may use silicon or Gallium Arsenide (GaAs) photo detectors.

Image sensors incorporate arrays of photodetectors. These photodetectors sense light, converting it from an optical to an electronic signal. FIG. 11 shows structure of and areas relating to quantum dot pixel chip structures (QDPCs) 100, according to example embodiments. As illustrated in FIG. 11, the QDPC 100 may be adapted as a radiation 1000 receiver where quantum dot structures 1100 are presented to receive the radiation 1000, such as light. The QDPC 100 includes, as will be described in more detail herein, quantum dot pixels 1800 and a chip 2000 where the chip is adapted to process electrical signals received from the quantum dot pixel 1800. The quantum dot pixel 1800 includes the quantum dot structures 1100 include several components and sub components such as quantum dots 1200, quantum dot materials 200 and particular configurations or quantum dot layouts 300 related to the dots 1200 and materials 200. The quantum dot structures 1100 may be used to create photodetector structures 1400 where the quantum dot structures are associated with electrical interconnections 1404. The electrical connections 1404 are provided to receive electric signals from the quantum dot structures and communicate the electric signals on to pixel circuitry 1700 associated with pixel structures 1500.

Just as the quantum dot structures 1100 may be laid out in various patterns, both planar and vertical, the photodetector structures 1400 may have particular photodetector geometric layouts 1402. The photodetector structures 1400 may be associated with pixel structures 1500 where the electrical interconnections 1404 of the photodetector structures are electrically associated with pixel circuitry 1700. The pixel structures 1500 may also be laid out in pixel layouts 1600 including vertical and planar layouts on a chip 2000 and the pixel circuitry 1700 may be associated with other components 1900, including memory for example. The pixel circuitry 1700 may include passive and active components for processing of signals at the pixel 1800 level. The pixel 1800 is associated both mechanically and electrically with the chip 2000. In example embodiments, the pixel structures 1500 and pixel circuitry 1700 include structures and circuitry for film binning and/or circuit binning of separate color elements for multiple pixels as described herein. From an electrical viewpoint, the pixel circuitry 1700 may be in communication with other electronics (e.g., chip processor 2008). The other electronics may be adapted to process digital signals, analog signals, mixed signals and the like and it may be adapted to process and manipulate the signals received from the pixel circuitry 1700. In other embodiments, a chip processor 2008 or other electronics may be included on the same semiconductor substrate as the QDPCs and may be structured using a system-on-chip architecture. The other electronics may include circuitry or software to provide digital binning in example embodiments. The chip 2000 also includes physical structures 2002 and other functional components 2004, which will also be described in more detail below.

The QDPC 100 detects electromagnetic radiation 1000, which in embodiments may be any frequency of radiation from the electromagnetic spectrum. Although the electromagnetic spectrum is continuous, it is common to refer to ranges of frequencies as bands within the entire electromagnetic spectrum, such as the radio band, microwave band, infrared band (IR), visible band (VIS), ultraviolet band (UV), X-rays, gamma rays, and the like. The QDPC 100 may be capable of sensing any frequency within the entire electromagnetic spectrum; however, embodiments herein may reference certain bands or combinations of bands within the electromagnetic spectrum. It should be understood that the use of these bands in discussion is not meant to limit the range of frequencies that the QDPC 100 may sense, and are only used as examples. Additionally, some bands have common usage sub-bands, such as near infrared (NIR) and far infrared (FIR), and the use of the broader band term, such as IR, is not meant to limit the QDPCs 100 sensitivity to any band or sub-band. Additionally, in the following description, terms such as "electromagnetic radiation," "radiation," "electromagnetic spectrum," "spectrum," "radiation spectrum," and the like are used interchangeably, and the term color is used to depict a select band of radiation 1000 that could be within any portion of the radiation 1000 spectrum, and is not meant to be limited to any specific range of radiation 1000 such as in visible 'color'.

In the example embodiment of FIG. 11, the nanocrystal materials and photodetector structures described above may be used to provide quantum dot pixels 1800 for a photosensor array, image sensor or other optoelectronic device. In example embodiments, the pixels 1800 include quantum dot structures 1100 capable of receiving radiation 1000, photodetectors structures adapted to receive energy from the quantum dot structures 1100 and pixel structures. The quantum dot pixels described herein can be used to provide the following in some embodiments: high fill factor, color binning, potential to stack, potential to go to small pixel sizes, high performance from larger pixel sizes, simplify color filter array, elimination of de-mosaicing, self-gain setting/automatic gain control, high dynamic range, global shutter capability, auto-exposure, local contrast, speed of readout, low noise readout at pixel level, ability to use larger process geometries (lower cost), ability to use generic fabrication processes, use digital fabrication processes to build analog circuits, adding other functions below the pixel such as memory, A to D, true correlated double sampling, binning, etc. Example embodiments may provide some or all of these features. However, some embodiments may not use these features.

A quantum dot 1200 may be a nanostructure, typically a semiconductor nanostructure that confines a conduction band electrons, valence band holes, or excitons (bound pairs of conduction band electrons and valence band holes) in all three spatial directions. A quantum dot exhibits in its absorption spectrum the effects of the discrete quantized energy spectrum of an idealized zero-dimensional system. The wave functions that correspond to this discrete energy spectrum are typically substantially spatially localized within the quantum dot, but extend over many periods of the crystal lattice of the material.

Figure 12:
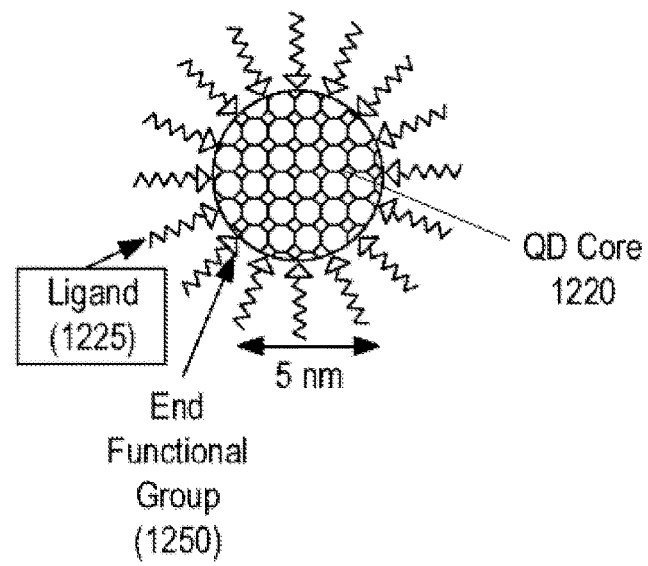
FIG. 12 shows an example of a quantum dot.

FIG. 12 shows an example of a quantum dot 1200. In one example embodiment, the QD 1200 has a core 1220 of a semiconductor or compound semiconductor material, such as PbS. Ligands 1225 may be attached to some or all of the outer surface or may be removed in some embodiments as described further below. In some embodiments, the cores 1220 of adjacent QDs may be fused together to form a continuous film of nanocrystal material with nanoscale features. In other embodiments, cores may be connected to one another by linker molecules.

Some embodiments of the QD optical devices are single image sensor chips that have a plurality of pixels, each of which includes a QD layer that is radiation 1000 sensitive, e.g., optically active, and at least two electrodes in electrical communication with the QD layer. The current and/or voltage between the electrodes is related to the amount of radiation 1000 received by the QD layer. Specifically, photons absorbed by the QD layer generate electron-hole pairs, such that, if an electrical bias is applied, a current flows. By determining the current and/or voltage for each pixel, the image across the chip can be reconstructed. The image sensor chips have a high sensitivity, which can be beneficial in low-radiation-detecting 1000 applications; a wide dynamic range allowing for excellent image detail; and a small pixel size. The responsivity of the sensor chips to different optical wavelengths is also tunable by changing the size of the QDs in the device, by taking advantage of the quantum size effects in QDs. The pixels can be made as small as 1 square micron or less, or as large as 30 microns by 30 microns or more or any range subsumed therein.

Figure 13:
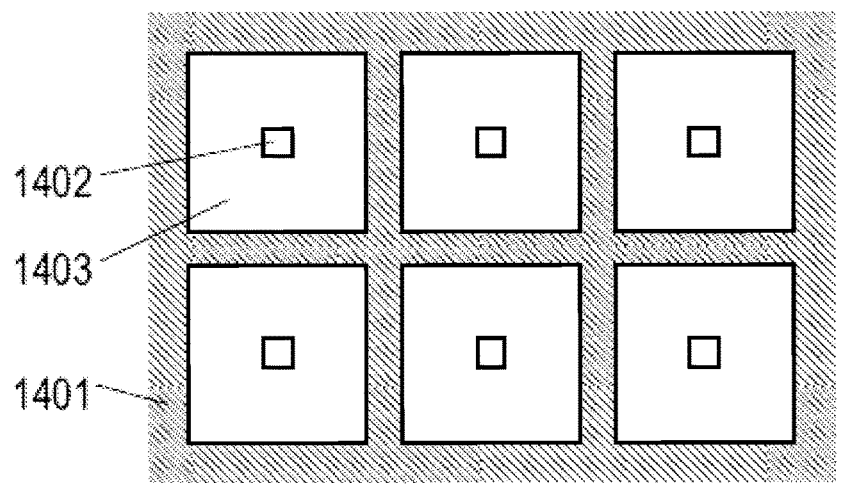
FIG. 13 shows a two-row by three-column sub-region within a generally larger array of top-surface electrodes.

The photodetector structure 1400 of FIGS. 11 and 13 shows a device configured so that it can be used to detect radiation 1000 in example embodiments. The detector may be 'tuned' to detect prescribed wavelengths of radiation 1000 through the types of quantum dot structures 1100 that are used in the photodetector structure 1400. The photodetector structure can be described as a quantum dot structure 1100 with an I/O for some input/output ability imposed to access the quantum dot structures' 1100 state. Once the state can be read, the state can be communicated to pixel circuitry 1700 through an electrical interconnection 1404, wherein the pixel circuitry may include electronics (e.g., passive and/or active) to read the state. In an embodiment, the photodetector structure 1400 may be a quantum dot structure 1100 (e.g., film) plus electrical contact pads so the pads can be associated with electronics to read the state of the associated quantum dot structure.

In embodiments, processing may include binning of pixels in order to reduce random noise associated with inherent properties of the quantum dot structure 1100 or with readout processes. Binning may involve the combining of pixels 1800, such as creating 2×2, 3×3, 5×5, or the like superpixels. There may be a reduction of noise associated with combining pixels 1800, or binning, because the random noise increases by the square root as area increases linearly, thus decreasing the noise or increasing the effective sensitivity. With the QDPC's 100 potential for very small pixels, binning may be utilized without the need to sacrifice spatial resolution, that is, the pixels may be so small to begin with that combining pixels doesn't decrease the required spatial resolution of the system. Binning may also be effective in increasing the speed with which the detector can be run, thus improving some feature of the system, such as focus or exposure. In example embodiments, binning may be used to combine subpixel elements for the same color or range of radiation (including UV and/or IR) to provide separate elements for a superpixel while preserving color/UV/IR resolution as further described below.

In embodiments the chip may have functional components that enable high-speed readout capabilities, which may facilitate the readout of large arrays, such as 5 Mpixels, 6 Mpixels, 8 Mpixels, 12 Mpixels, or the like. Faster readout capabilities may require more complex, larger transistor-count circuitry under the pixel 1800 array, increased number of layers, increased number of electrical interconnects, wider interconnection traces, and the like.

In embodiments, it may be desirable to scale down the image sensor size in order to lower total chip cost, which may be proportional to chip area. However, shrinking chip size may mean, for a given number of pixels, smaller pixels. In existing approaches, since radiation 1000 must propagate through the interconnect layer onto the monolithically integrated silicon photodiode lying beneath, there is a fill-factor compromise, whereby part of the underlying silicon area is obscured by interconnect; and, similarly, part of the silicon area is consumed by transistors used in read-out. One workaround is micro-lenses, which add cost and lead to a dependence in photodiode illumination on position within the chip (center vs. edges); another workaround is to go to smaller process geometries, which is costly and particularly challenging within the image sensor process with its custom implants.

In embodiments, the technology discussed herein may provide a way around these compromises. Pixel size, and thus chip size, may be scaled down without decreasing fill factor. Larger process geometries may be used because transistor size, and interconnect line-width, may not obscure pixels since the photodetectors are on the top surface, residing above the interconnect. In the technology proposed herein, large geometries such as 0.13 μm and 0.18 μm may be employed without obscuring pixels. Similarly, small geometries such as 90 nm and below may also be employed, and these may be standard, rather than image-sensor-customized, processes, leading to lower cost. The use of small geometries may be more compatible with high-speed digital signal processing on the same chip. This may lead to faster, cheaper, and/or higher-quality image sensor processing on chip. Also, the use of more advanced geometries for digital signal processing may contribute to lower power consumption for a given degree of image sensor processing functionality.

Figure 15:
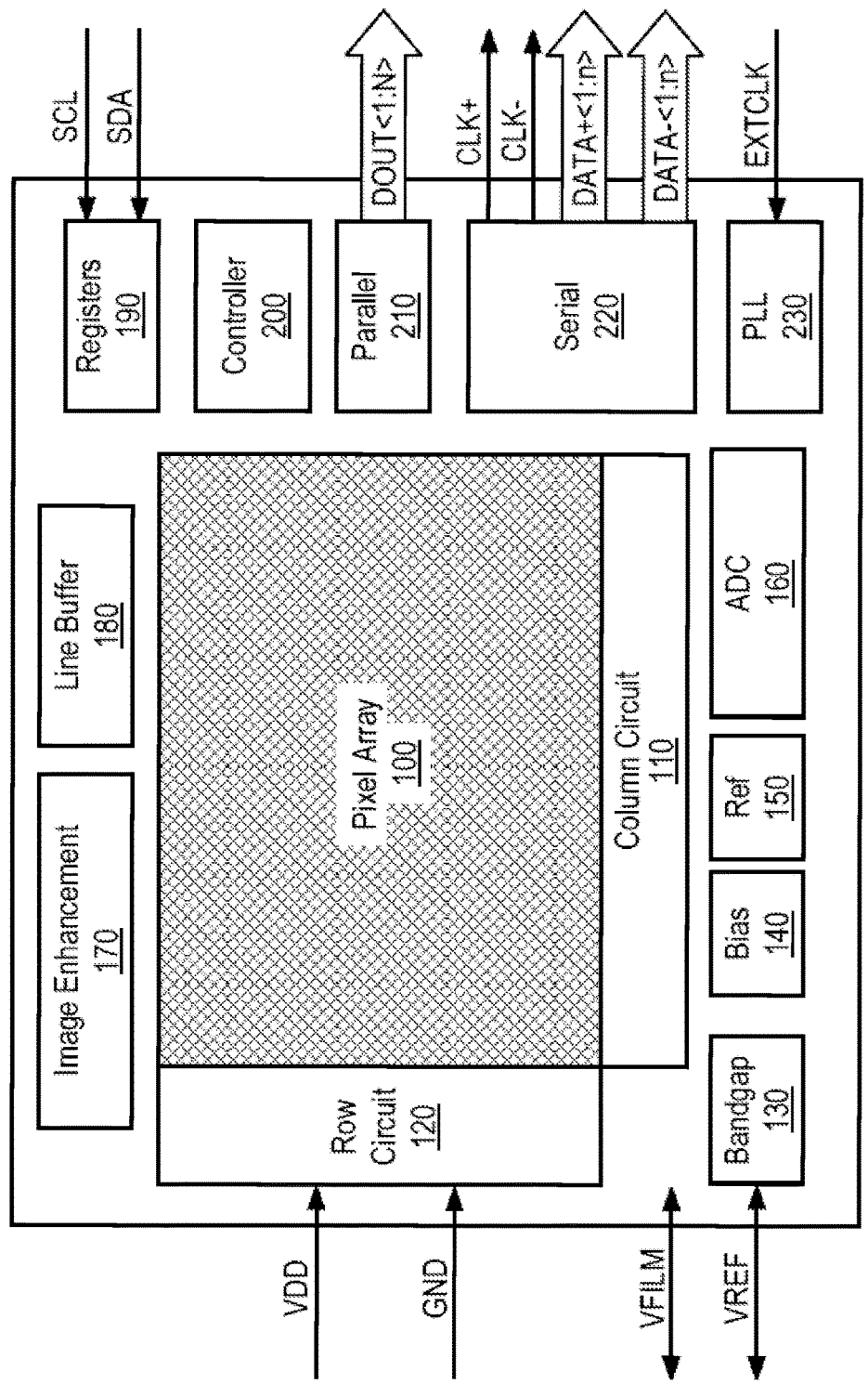
FIG. 15 is a block diagram of an example system configuration that may be used in combination with embodiments described herein.

An example integrated circuit system that can be used in combination with the above photodetectors, pixel regions and pixel circuits will now be described in connection with FIG. 15. FIG. 15 is a block diagram of an image sensor integrated circuit (also referred to as an image sensor chip). The chip is shown to include:

a pixel array (100) in which incident light is converted into electronic signals, and in which electronic signals are integrated into charge stores whose contents and voltage levels are related to the integrated light incident over the frame period; the pixel array may include color filters and electrode structures for color film binning as described further below;

row and column circuits (110 and 120) which are used to reset each pixel, and read the signal related to the contents of each charge store, in order to convey the information related to the integrated light over each pixel over the frame period to the outer periphery of the chip; the pixel circuitry may include circuitry for color binning as described further below;

analog circuits (130, 140, 150, 160, 230). The pixel electrical signal from the column circuits is fed into the analog-to-digital convert (160) where it is converted into a digital number representing the light level at each pixel. The pixel array and ADC are supported by analog circuits that provide bias and reference levels (130, 140, & 150).

digital circuits (170, 180, 190, 200). The Image Enhancement circuitry (170) provides image enhancement functions to the data output from ADC to improve the signal to noise ratio. Line buffer (180) temporarily stores several lines of the pixel values to facilitate digital image processing and IO functionality. (190) is a bank of registers that prescribe the global operation of the system and/or the frame format. Block 200 controls the operation of the chip. The digital circuits may also include circuits or software for digital color binning;

IO circuits (210 & 220) support both parallel input/output and serial input/output. (210) is a parallel IO interface that outputs every bit of a pixel value simultaneously. (220) is a serial IO interface where every bit of a pixel value is output sequentially; and a phase-locked loop (230) provides a clock to the whole chip.

In a particular example embodiment, when 0.11 μm CMOS technology node is employed, the periodic repeat distance of pixels along the row-axis and along the column-axis may be 900 nm, 1.1 μm, 1.2 μm, 1.4 μm, 1.75 μm, 2.2 μm, or larger. The implementation of the smallest of these pixels sizes, especially 900 nm, 1.1 μm, and 1.2 μm, may require transistor sharing among pairs or larger group of adjacent pixels in some embodiments.

Very small pixels can be implemented in part because all of the silicon circuit area associated with each pixel can be used for read-out electronics since the optical sensing function is achieved separately, in another vertical level, by the optically-sensitive layer that resides above the interconnect layer.

Because the optically sensitive layer and the read-out circuit that reads a particular region of optically sensitive material exist on separate planes in the integrated circuit, the shape (viewed from the top) of (1) the pixel read-out circuit and (2) the optically sensitive region that is read by (1); can be generally different. For example it may be desired to define an optically sensitive region corresponding to a pixel as a square; whereas the corresponding read-out circuit may be most efficiently configured as a rectangle.

In an imaging array based on a top optically sensitive layer connected through vias to the read-out circuit beneath, there exists no imperative for the various layers of metal, vias, and interconnect dielectric to be substantially or even partially optically transparent, although they may be transparent in some embodiments. This contrasts with the case of front-side-illuminated CMOS image sensors in which a substantially transparent optical path must exist traversing the interconnect stack.

Pixel circuitry may be defined to include components beginning at the electrodes in contact with the quantum dot material 200 and ending when signals or information is transferred from the pixel to other processing facilities, such as the functional components 2004 of the underlying chip 200 or another quantum dot pixel 1800. Beginning at the electrodes on the quantum dot material 200, the signal is translated or read. In embodiments, the quantum dot material 200 may provide a change in current flow in response to radiation 1000. The quantum dot pixel 1800 may require bias circuitry 1700 in order to produce a readable signal. This signal in turn may then be amplified and selected for readout.

Figure 14:
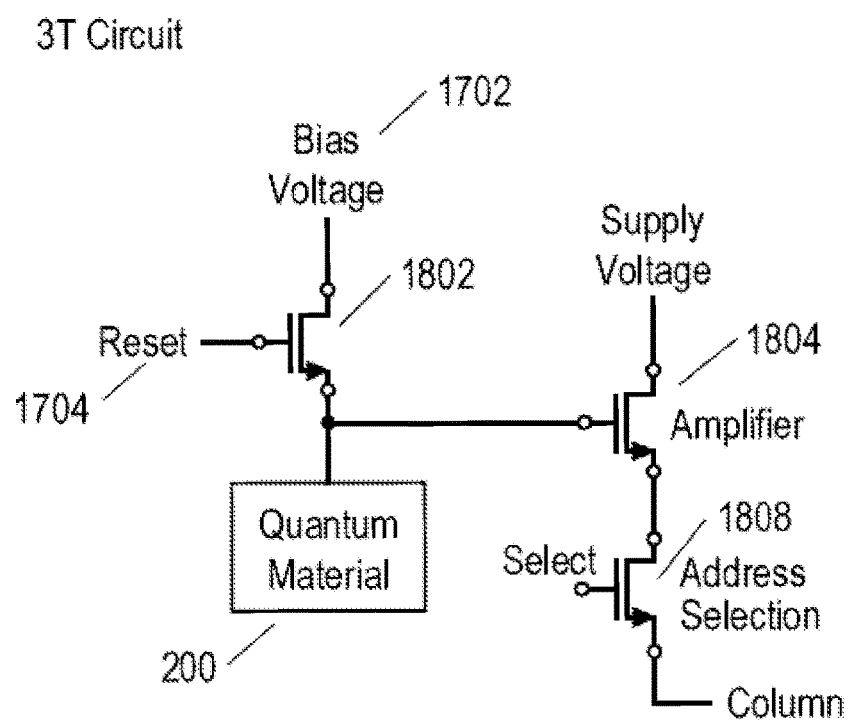
FIG. 14 illustrates a 3T transistor configuration for interfacing with the quantum dot material.

One embodiment of a pixel circuit shown in FIG. 14 uses a reset-bias transistor 1802, amplifier transistor 1804, and column address transistor 1808. This three-transistor circuit configuration may also be referred to as a 3T circuit. Here, the reset-bias transistor 1802 connects the bias voltage 1702 to the photoconductive photovoltaic quantum dot material 200 when reset 1704 is asserted, thus resetting the electrical state of the quantum dot material 200. After reset 1704, the quantum dot material 200 may be exposed to radiation 1000, resulting in a change in the electrical state of the quantum dot material 200, in this instance a change in voltage leading into the gate of the amplifier 1804. This voltage is then boosted by the amplifier transistor 1804 and presented to the address selection transistor 1808, which then appears at the column output of the address selection transistor 1808 when selected. In some embodiments, additional circuitry may be added to the pixel circuit to help subtract out dark signal contributions. In other embodiments, adjustments for dark signal can be made after the signal is read out of the pixel circuit. In example, embodiments, additional circuitry may be added for film binning or circuit binning.

Figure 16:
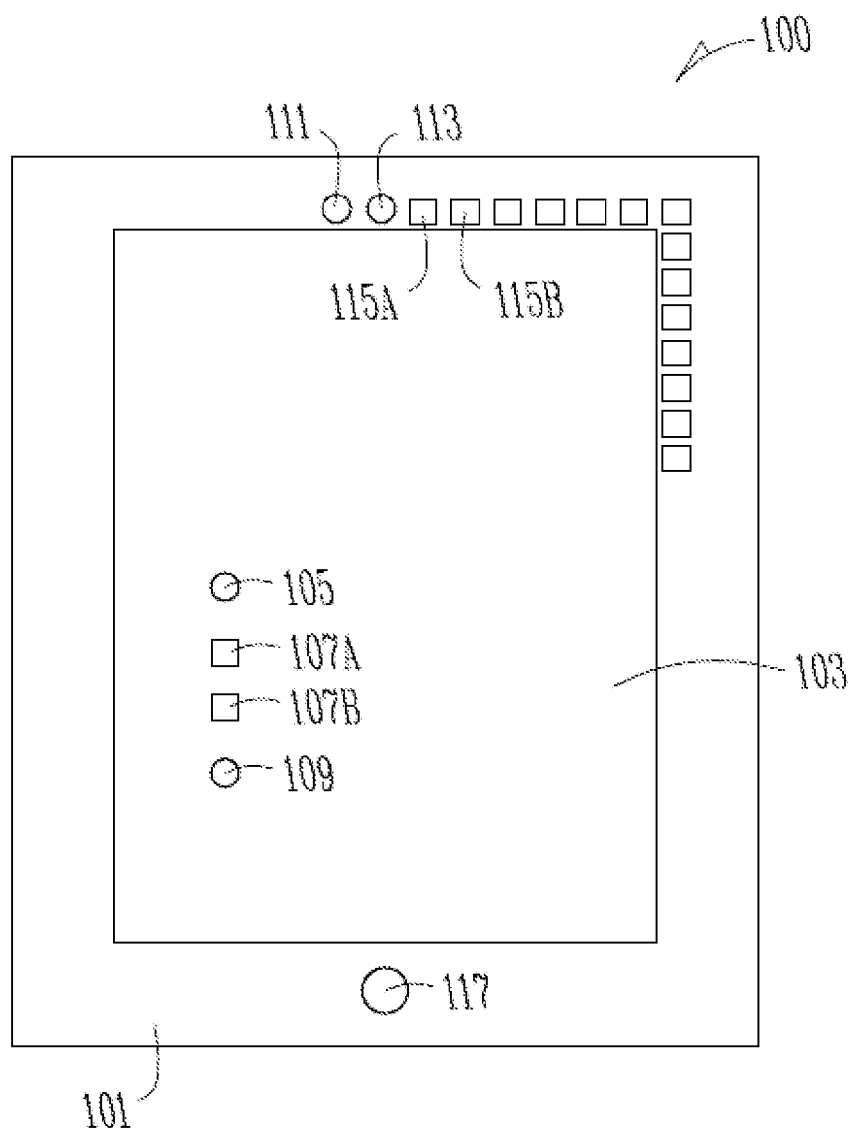

FIG. 16 shows an embodiment of a single-plane computing device 100 that may be used in computing, communication, gaming, interfacing, and so on. The single-plane computing device 100 is shown to include a peripheral region 101 and a display region 103. A touch-based interface device 117, such as a button or touchpad, may be used in interacting with the single-plane computing device 100.

An example of a first camera module 113 is shown to be situated within the peripheral region 101 of the single-plane computing device 100 and is described in further detail, below. Example light sensors 115A, 115B are also shown to be situated within the peripheral region 101 of the single-plane computing device 100 and are described in further detail, below, with reference to FIG. 19. An example of a second camera module 105 is shown to be situated in the display region 103 of the single-plane computing device 100 and is described in further detail, below, with reference to FIG. 18.

Examples of light sensors 107A, 107B, shown to be situated in the display region 103 of the single-plane computing device 100 and are described in further detail, below, with reference to FIG. 19. An example of a first source of optical illumination 111 (which may be structured or unstructured) is shown to be situated within the peripheral region 101 of the single-plane computing device 100. An example of a second source of optical illumination 109 is shown to be situated in the display region 103.

In embodiments, the display region 103 may be a touch-screen display. In embodiments, the single-plane computing device 100 may be a tablet computer. In embodiments, the single-plane computing device 100 may be a mobile handset.

Figure 17:
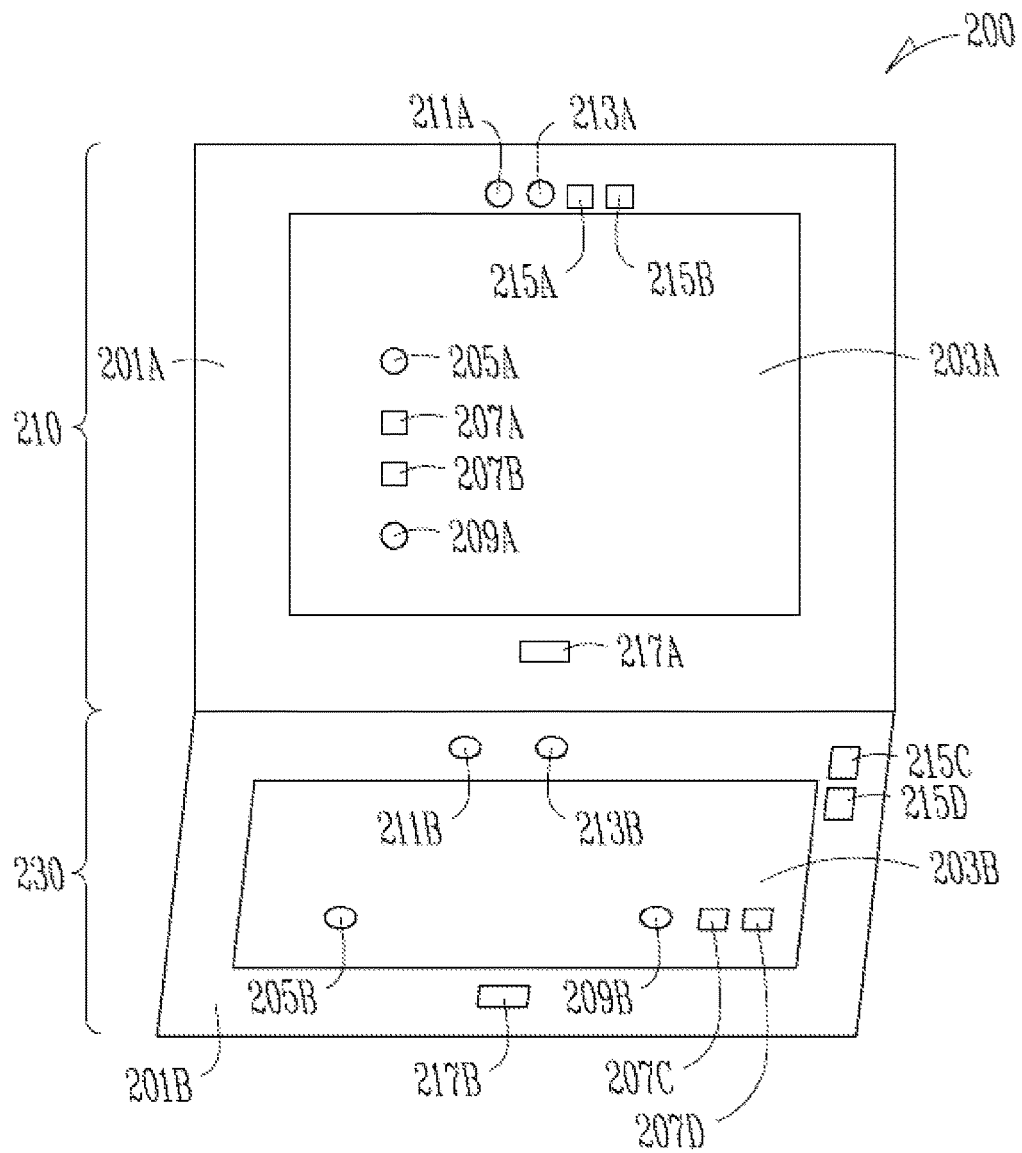

FIG. 17 shows an embodiment of a double-plane computing device 200 that may be used in computing, communication, gaming, interfacing, and so on. The double-plane computing device 200 is shown to include a first peripheral region 201A and a first display region 203A of a first plane 210, a second peripheral region 201B and a second display region 203B of a second plane 230, a first touch-based interface device 217A of the first plane 210 and a second touch-based interface device 217B of the second plane 230. The example touch-based interface devices 217A, 217B may be buttons or touchpads that may be used in interacting with the double-plane computing device 200. The second display region 203B may also be an input region in various embodiments.

The double-plane computing device 200 is also shown to include examples of a first camera module 213A in the first peripheral region 201A and a second camera module 213B in the second peripheral region 201B. The camera modules 213A, 213B are described in more detail, below, with reference to FIG. 18. As shown, the camera modules 213A, 213B are situated within the peripheral regions 201A, 201B of the double-plane computing device 200. Although a total of two camera modules are shown, a person of ordinary skill in the art will recognize that more or fewer light sensors may be employed.

A number of examples of light sensors 215A, 215B, 215C, 215D, are shown situated within the peripheral regions 201A, 201B of the double-plane computing device 200. Although a total of four light sensors are shown, a person of ordinary skill in the art will recognize that more or fewer light sensors may be employed. Examples of the light sensors 215A, 215B, 215C, 215D, are described, below, in further detail with reference to FIG. 18. As shown, the light sensors 215A, 215B, 215C, 215D, are situated within the peripheral regions 201A, 201B of the double-plane computing device 200.

The double-plane computing device 200 is also shown to include examples of a first camera module 205A in the first display region 203A and a second camera module 205B in the second display region 203B. The camera modules 205A, 205B are described in more detail, below, with reference to FIG. 18. As shown, the camera modules 205A, 205B are situated within the display regions 203A, 203B of the double-plane computing device 200. Also shown as being situated within the display regions 203A, 203B of the double-plane computing device 200 are examples of light sensors 207A, 207B, 207C, 207D. Although a total of four light sensors are shown, a person of ordinary skill in the art will recognize that more or fewer light sensors may be employed. Examples of the light sensors 207A, 207B, 207C, 207D are described, below, in further detail with reference to FIG. 19. Example sources of optical illumination 211A, 211B are shown situated within the peripheral region 201A, 201B and other example sources of optical illumination 209A, 209B are shown situated within one of the display regions 203A, 203B and are also described with reference to FIG. 19, below. A person of ordinary skill in the art will recognize that various numbers and locations of the described elements, other than those shown or described, may be implemented.

In embodiments, the double-plane computing device 200 may be a laptop computer. In embodiments, the double-plane computing device 200 may be a mobile handset.

Figure 18:
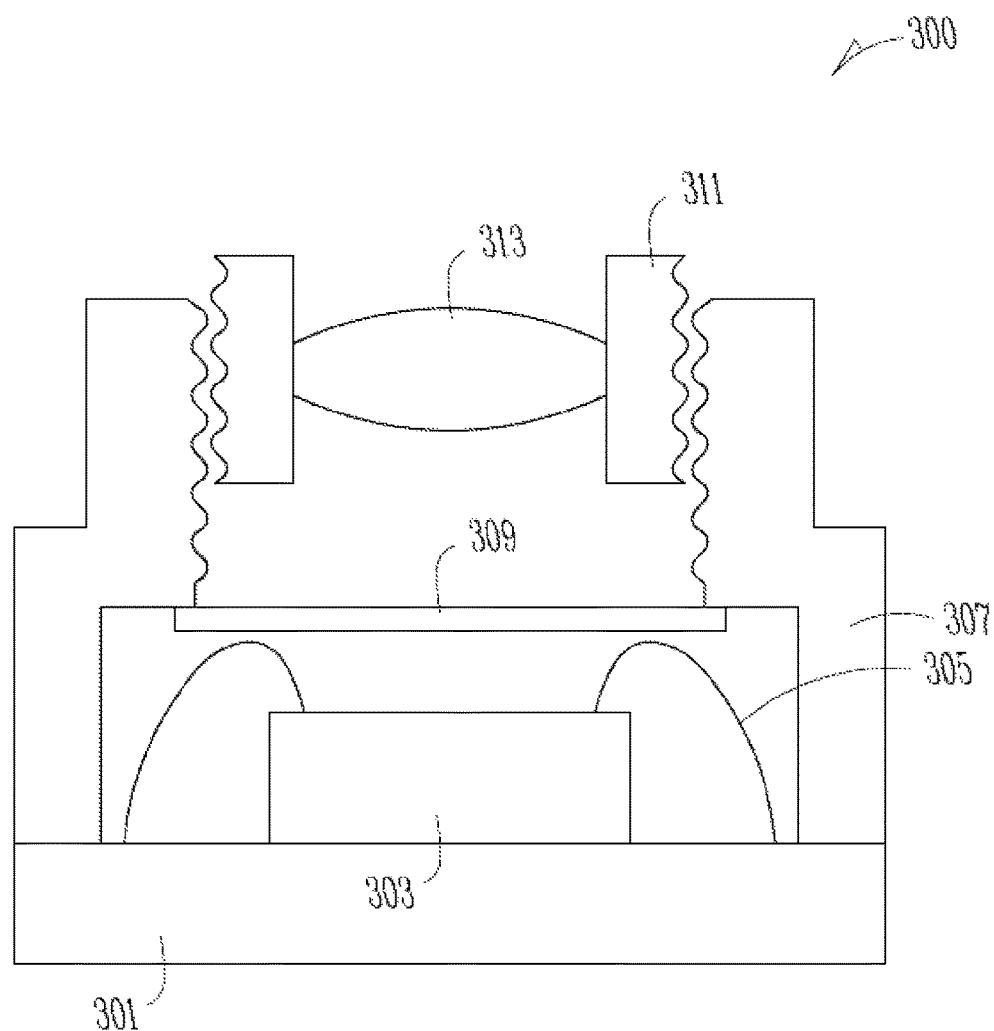
FIG. 18 shows an embodiment of a camera module that may be used with the computing devices of FIG. 16 or FIG. 17.

With reference now to FIG. 18, an embodiment of a camera module 300 that may be used with the computing devices of FIG. 16 or FIG. 17 is shown. The camera module 300 may correspond to the camera module 113 of FIG. 16 or the camera modules 213A, 213B of FIG. 17. As shown in FIG. 18, the camera module 300 includes a substrate 301, an image sensor 303, and bond wires 305. A holder 307 is positioned above the substrate. An optical filter 309 is shown mounted to a portion of the holder 307. A barrel 311 holds a lens 313 or a system of lenses.

Figure 19:
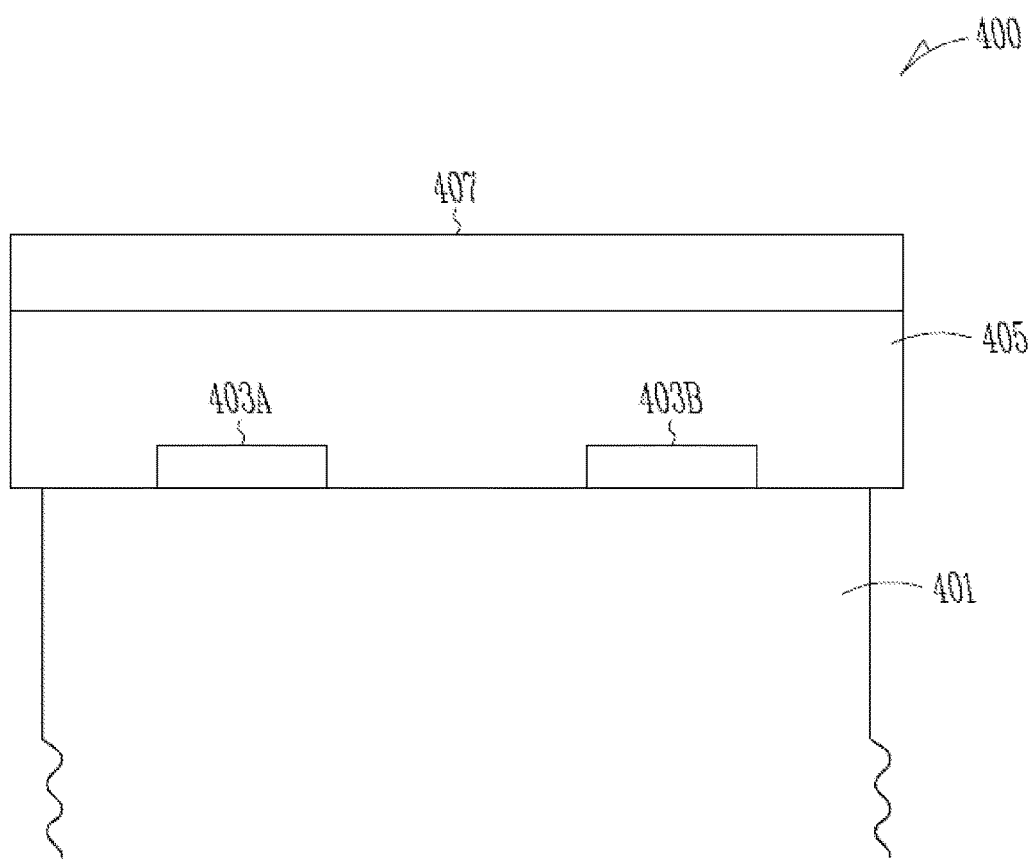
FIG. 19 shows an embodiment of a light sensor that may be used with the computing devices of FIG. 16 or FIG. 17.

FIG. 19 shows an embodiment of a light sensor 400 that may be used with the computing devices of FIG. 16 or FIG. 17 an example embodiment of a light sensor. The light sensor 400 may correspond to the light sensors 115A, 115B of FIG. 16 of the light sensors 215A, 215B, 215C, 215D of FIG. 17. The light sensor 400 is shown to include a substrate 401, which may correspond to a portion of either or both of the peripheral region 101 or the display region 103 of FIG. 16. The substrate 401 may also correspond to a portion of either or both of the peripheral regions 201A, 201B or the display regions 203A, 203B of FIG. 17. The light sensor 400 is also shown to include electrodes 403A, 403B used to provide a bias across light-absorbing material 405 and to collect photoelectrons therefrom. An encapsulation material 407 or a stack of encapsulation materials is shown over the light-absorbing material 405. Optionally, the encapsulation material 407 may include conductive encapsulation material for biasing and/or collecting photoelectrons from the light-absorbing material 405.

Elements of a either the single-plane computing device 100 of FIG. 16, or the double-plane computing device 200 of FIG. 17, may be connected or otherwise coupled with one another. Embodiments of the computing devices may include a processor. It may include functional blocks, and/or physically distinct components, that achieve computing, image processing, digital signal processing, storage of data, communication of data (through wired or wireless connections), the provision of power to devices, and control of devices. Devices that are in communication with the processor include devices of FIG. 16 may include the display region 103, the touch-based interface device 117, the camera modules 105, 113, the light sensors 115A, 115B, 107A, 107B, and the sources of optical illumination 109, 111. Similarly correspondences may apply to FIG. 17 as well.

The light sensor of FIG. 19 may include a light-absorbing material 405 of various designs and compositions. In embodiments, the light-absorbing material may be designed to have an absorbance that is sufficiently small, across the visible wavelength region approximately 450 nm to 650 nm, such that, in cases in which the light sensor of FIG. 19 is incorporated into the display region of a computing device, only a modest fraction of visible light incident upon the sensor is absorbed by the light-absorbing material. In this case, the quality of the images displayed using the display region is not substantially compromised by the incorporation of the light-absorbing material along the optical path of the display. In embodiments, the light-absorbing material 405 may absorb less than 30%, or less than 20%, or less than 10%, of light impinging upon it in across the visible spectral region.

In embodiments, the electrodes 403A, 403B, and, in the case of a conductive encapsulant for 407, the top electrode 407, may be constituted using materials that are substantially transparent across the visible wavelength region approximately 450 nm to 650 nm. In this case, the quality of the images displayed using the display region is not substantially compromised by the incorporation of the light-absorbing material along the optical path of the display.

In embodiments, the light sensor of FIG. 19 may include a light-sensing material capable of sensing infrared light. In embodiments, the light-sensing material may be a semiconductor having a bandgap corresponding to an infrared energy, such as in the range 0.5 eV-1.9 eV. In embodiments, the light-sensing material may have measurable absorption in the infrared spectral range; and may have measurable absorption also in the visible range. In embodiments, the light-sensing material may absorb a higher absorbance in the visible spectral range as in the infrared spectral range; yet may nevertheless be used to sense gesture-related signals in the infrared spectral range.

In an example embodiment, the absorbance of the light-sensing display-incorporated material may lie in the range 2-20% in the visible; and may lie in the range 0.1-5% in the infrared. In an example embodiment, the presence of visible light in the ambient, and/or emitted from the display, may produce a background signal within the light sensor, as a consequence of the material visible-wavelength absorption within the light-absorbing material of the light sensor. In an example embodiment, sensing in the infrared region may also be achieved. The light sources used in aid of gesture recognition may be modulated using spatial, or temporal, codes, allowing them to be distinguished from the visible-wavelength-related component of the signal observed in the light sensor. In an example embodiment, at least one light source used in aid of gesture recognition may be modulated in time using a code having a frequency component greater than 100 Hz, 1000 Hz, 10 kHz, or 100 kHz. In an example embodiment, the light sensor may have a temporal response having a cutoff frequency greater than said frequency components. In embodiments, circuitry may be employed to ensure that the frequency component corresponding to gesture recognition can be extracted and monitored, with the background components related to the room ambient, the display illumination, and other such non-gesture-related background information substantially removed. In this example, the light sensors, even though they absorb both visible and infrared light, can provide a signal that is primarily related to gestural information of interest in gesture recognition.

In an example embodiment, an optical source having a total optical power of approximately 1 mW may be employed. When illuminating an object a distance approximately 10 cm away, where the object has area approximately 1 cm2 and diffuse reflectance approximately 20%, then the amount of power incident on a light sensor having area 1 cm2 may be of order 100 pW. In an example embodiment, a light sensor having absorbance of 1% may be employed, corresponding to a photocurrent related to the light received as a consequence of the illumination via the optical source, and reflected or scattered off of the object, and thus incident onto the light sensor, may therefore be of order pW. In example embodiments, the electrical signal reported by the light sensor may correspond to approximately pA signal component at the modulation frequency of the optical source. In example embodiments, a large additional signal component, such as in the nA or µA range, may arise due to visible and infrared background, display light, etc. In example embodiments, the relatively small signal components, with its distinctive temporal and/or spatial signature as provided by modulation (in time and/or space) of the illumination source, may nevertheless be isolated relative to other background/signal, and may be employed to discern gestural information.

In embodiments, light-absorbing material 405 may consist of a material that principally absorbs infrared light in a certain band; and that is substantially transparent to visible-wavelength light. In an example embodiment, a material such as PBDTT-DPP, the near-infrared light-sensitive polymer poly(2,60-4,8-bis(5-ethylhexylthienyl)benzo-[1,2-b;3,4-b]dithiophene-alt-5-dibutyloctyl-3,6-bis(5-bromothiophen-2-yl)pyrrolo[3,4-c]pyrrole-1,4-dione), may be employed as a component of the light-absorbing layer.

In embodiments, the electronic signal produced by the light sensor may be communicated to a device for electronic amplification. This device may amplify a specific electronic frequency band more than other bands, producing an enhanced signal component that is related to the gestural information. The signal from the light sensor, possibly with the combination of amplification (potentially frequency-dependent), may be input to an analog-to-digital converter that can produce a digital signal related to the gestural information. The digital information related to gestural information can be further conveyed to other integrated circuits and/or signal processing engines in the context of a system. For example, it may be conveyed to an application processor.

In embodiments, optical sources used to illuminate a volume of space, with the goal of enabling gesture recognition, may use illumination at a near infrared wavelength that is substantially unseen by the human eye. In an example embodiment, a light-emitting diode having center wavelength of approximately 950 nm may be employed.

In embodiments, gesture recognition may be accomplished by combining information from at least one camera, embedded into the computing device, and having a lens providing a substantially focused image onto an image sensor that is part of the camera; and may also incorporate sensors in the peripheral region, and/or integrated into the display region. In embodiments, the distributed sensors may provide general information on the spatio-temporal movements of the object being imaged; and the signals from the at least one camera(s) may be combined with the distributed sensors' signals to provide a more spatially-/temporally-accurate picture of the two- or three-dimensional motion of the object whose gesture is to be recognized. In an example embodiment, the camera may employ an image sensor providing a modest spatial resolution, such as QVGA, VGA, SVGA, etc., and thus be implemented using an image sensor having small die size and thus low cost; and also be implemented using a camera module having small x, y, and z form factor, enabling minimal consumption of peripheral region area, and no substantial addition to the z-height of the tablet or other computing device.

In embodiments, a moderate frame rate, such as 15 fps, 30 fps, or 60 fps may be employed, which, combined with a modest resolution, enables a low-cost digital communication channel and moderate complexity of signal processing in the recognition of gestures. In embodiments, the at least one camera module may implement wide field of view imaging in order to provide a wide angular range in the assessment of gestures in relation to a display. In embodiments, at least one camera module may be tilted, having its angle of regard nonparallel to the normal direction (perpendicular direction) to the display, enabling the at least one camera to image an angular extent in closer proximity to the display.

In embodiments, multiple cameras may be employed in combination, each having an angle of regard distinct from at least one another, thereby enabling gestures in moderate proximity to the display to be imaged and interpreted. In embodiments, the at least one camera may employ an image sensor sensitized using light-detecting materials that provide high quantum efficiency, for example, greater than 30%, at near infrared wavelength used by the illuminating source; this enables reduced requirement for power and/or intensity in the illuminating source. In embodiments, the illuminating source may be modulated in time at a specific frequency and employing a specific temporal pattern (e.g., a series of pulses of known spacing and width in time); and the signal from the at least one camera and/or the at least one distributed sensor may be interpreted with knowledge of the phase and temporal profile of the illuminating source; and in this manner, increased signal-to-noise ratio, akin to lock-in or boxcar-averaging or other filtering and/or analog or digital signal processing methods, may be used to substantially pinpoint the modulated, hence illuminated signal, and substantially remove or minimize the background signal associated with the background scene.

Figure 20:
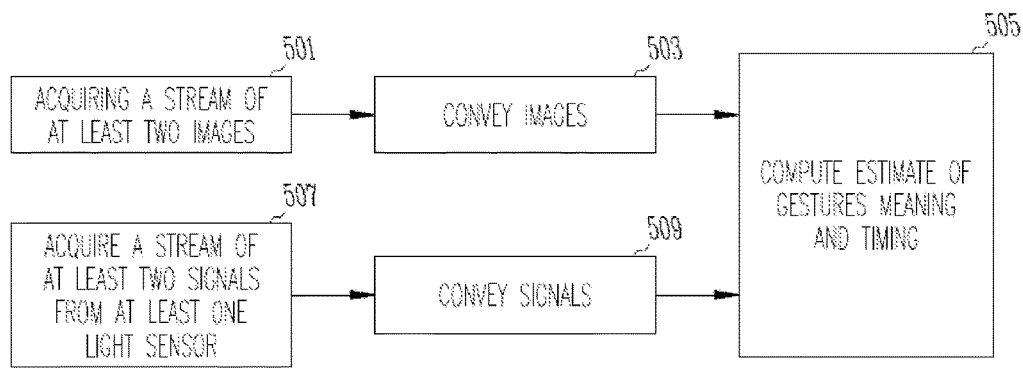
FIG. 20 and FIG. 21 show embodiments of methods of gesture recognition.

FIG. 20 shows an embodiment of a method of gesture recognition. The method comprises an operation 501 that includes acquiring a stream in time of at least two images from each of at least one of the camera module(s); and an operation 507 that includes also acquiring a stream, in time, of at least two signals from each of at least one of the light sensors. The method further comprises, at operations 503 and 509, conveying the images and/or signals to a processor. The method further comprises, at operation 505, using the processor, an estimate of a gesture's meaning, and timing, based on the combination of the images and signals.

Figure 21:
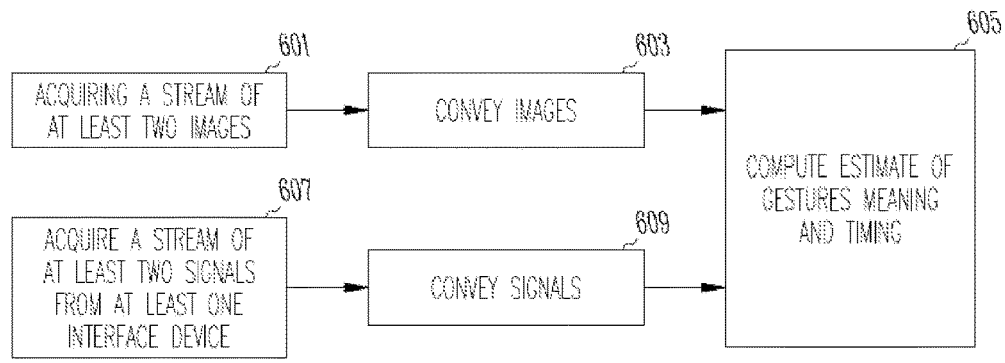

FIG. 21 shows an embodiment of a method of gesture recognition. The method comprises an operation 601 that includes acquiring a stream in time of at least two images from each of at least one of the camera modules; and an operation 607 that includes also acquiring a stream, in time, of at least two signals from each of at least one of the touch-based interface devices. The method further comprises, at operations 603 and 609, conveying the images and/or signals to a processor. The method further comprises, at operation 605, using the processor, an estimate of a gesture's meaning, and timing, based on the combination of the images and signals.

In embodiments, signals received by at least one of (1) the touch-based interface devices; (2) the camera modules; (3) the light sensors, each of these either within the peripheral and/or the display or display/input regions, may be employed and, singly or jointly, used to determine the presence, and the type, of gesture indicated by a user of the device.

Referring again to FIG. 20, in embodiments, a stream, in time, of images is acquired from each of at least one of the camera modules. A stream, in time, of at least two signals from each of at least one of the light sensors is also acquired. In embodiments, the streams may be acquired from the different classes of peripheral devices synchronously. In embodiments, the streams may be acquired with known time stamps indicating when each was acquired relative to the others, for example, to some conference reference time point. In embodiments, the streams are conveyed to a processor. The processor computes an estimate of the gesture's meaning, and timing, based on the combination of the images and signals.

In embodiments, at least one camera module has a wide field of view exceeding about 40°. In embodiments, at least one camera module employs a fisheye lens. In embodiments, at least one image sensor achieves higher resolution at its center, and lower resolution in its periphery. In embodiments, at least one image sensor uses smaller pixels near its center and larger pixels near its periphery.

In embodiments, active illumination via at least one light source; combined with partial reflection and/or partial scattering off of a proximate object; combined with light sensing using at least one optical module or light sensor; may be combined to detect proximity to an object. In embodiments, information regarding such proximity may be used to reduce power consumption of the device. In embodiments, power consumption may be reduced by dimming, or turning off, power-consuming components such as a display.

In embodiments, at least one optical source may emit infrared light. In embodiments, at least one optical source may emit infrared light in the near infrared between about 700 nm and about 1100 nm. In embodiments, at least one optical source may emit infrared light in the short-wavelength infrared between about 1100 nm and about 1700 nm wavelength. In embodiments, the light emitted by the optical source is substantially not visible to the user of the device.

In embodiments, at least one optical source may project a structured light image. In embodiments, spatial patterned illumination, combined with imaging, may be employed to estimate the relative distance of objects relative to the imaging system.

In embodiments, at least two lensing systems may be employed to image a scene, or portions of a scene, onto two distinct regions of a monolithically-integrated single image sensor integrated circuit; and the patterns of light thus acquired using the image sensor integrated circuit may be used to aid in estimating the relative or absolute distances of objects relative to the image sensor system.

In embodiments, at least two lensing systems may be employed to image a scene, or portions of a scene, onto two distinct image sensor integrated circuits housed within a single camera system; and the patterns of light thus acquired using the image sensor integrated circuits may be used to aid in estimating the relative or absolute distances of objects relative to the image sensor system.

In embodiments, at least two lensing systems may be employed to image a scene, or portions of a scene, onto two distinct image sensor integrated circuits housed within separate camera systems or subsystems; and the patterns of light thus acquired using the image sensor integrated circuits may be used to aid in estimating the relative or absolute distances of objects relative to the image sensor systems or subsystems.

In embodiments, the different angles of regard, or perspectives, from which the at least two optical systems perceive the scene, may be used to aid in estimating the relative or absolute distances of objects relative to the image sensor system.

In embodiments, light sensors such as the light sensors 115A, 115B situated in the peripheral region 101 of FIG. 16, and/or the light sensors 107A, 107B situated in the display region 103 of FIG. 16, may be used singly, or in combination with one another, and/or in combination with camera modules, to acquire information about a scene. In embodiments, light sensors may employ lenses to aid in directing light from certain regions of a scene onto specific light sensors. In embodiments, light sensors may employ systems for aperturing, such as light-blocking housings, that define a limited angular range over which light from a scene will impinge on a certain light sensor. In embodiments, a specific light sensor will, with the aid of aperturing, be responsible for sensing light from within a specific angular cone of incidence.

In embodiments, the different angles of regard, or perspectives, from which the at least two optical systems perceive the scene, may be used to aid in estimating the relative or absolute distances of objects relative to the image sensor system.

In embodiments, the time sequence of light detector from at least two light sensors may be used to estimate the direction and velocity of an object. In embodiments, the time sequence of light detector from at least two light sensors may be used to ascertain that a gesture was made by a user of a computing device. In embodiments, the time sequence of light detector from at least two light sensors may be used to classify the gesture that was made by a user of a computing device. In embodiments, information regarding the classification of a gesture, as well as the estimated occurrence in time of the classified gesture, may be conveyed to other systems or subsystems within a computing device, including to a processing unit.

In embodiments, light sensors may be integrated into the display region of a computing device, for example, the light sensors 107A, 107B of FIG. 16. In embodiments, the incorporation of the light sensors into the display region can be achieved without the operation of the display in the conveyance of visual information to the user being substantially altered. In embodiments, the display may convey visual information to the user principally using visible wavelengths in the range of about 400 nm to about 650 nm, while the light sensors may acquire visual information regarding the scene principally using infrared light of wavelengths longer than about 650 nm. In embodiments, a 'display plane' operating principally in the visible wavelength region may reside in front of—closer to the user—than a 'light sensing plane' that may operate principally in the infrared spectral region.

In embodiments, structured light of a first type may be employed, and of a second type may also be employed, and the information from the at least two structured light illuminations may be usefully combined to ascertain information regarding a scene that exceeds the information contained in either isolated structured light image.

In embodiments, structured light of a first type may be employed to illuminate a scene and may be presented from a first source providing a first angle of illumination; and structured light of a second type may be employed to illuminate a scene and may be presented from a second source providing a second angle of illumination.

In embodiments, structured light of a first type and a first angle of illumination may be sensed using a first image sensor providing a first angle of sensing; and also using a second image sensor providing a second angle of sensing.

In embodiments, structured light having a first pattern may be presented from a first source; and structured light having a second pattern may be presented from a second source.

In embodiments, structured light having a first pattern may be presented from a source during a first time period; and structured light having a second pattern may be presented from a source during a second time period.

In embodiments, structured light of a first wavelength may be used to illuminate a scene from a first source having a first angle of illumination; and structured light of a second wavelength may be used to illuminate a scene from a second source having a second angle of illumination.

In embodiments, structured light of a first wavelength may be used to illuminate a scene using a first pattern; and structured light of a second wavelength may be used to illuminate a scene using a second pattern. In embodiments, a first image sensor may sense the scene with a strong response at the first wavelength and a weak response at the second wavelength; and a second image sensor may sense the scene with a strong response at the second wavelength and a weak response at the first wavelength. In embodiments, an image sensor may consist of a first class of pixels having strong response at the first wavelength and weak response at the second wavelength; and of a second class of pixels having strong response at the second wavelength and weak response at the first wavelength.

Embodiments include image sensor systems that employ a filter having a first bandpass spectral region; a first bandblock spectral region; and a second bandpass spectral region. Embodiments include the first bandpass region corresponding to the visible spectral region; the first bandblock spectral region corresponding to a first portion of the infrared; and the second bandpass spectral region corresponding to a second portion of the infrared. Embodiments include using a first time period to detect primarily the visible-wavelength scene; and using active illumination within the second bandpass region during a second time period to detect the sum of a visible-wavelength scene and an actively-illuminated infrared scene; and using the difference between images acquired during the two time periods to infer a primarily actively-illuminated infrared scene. Embodiments include using structured light during the second time period. Embodiments include using infrared structured light. Embodiments include using the structured light images to infer depth information regarding the scene; and in tagging, or manipulating, the visible images using information regarding depth acquired based on the structured light images.

In embodiments, gestures inferred may include one-thumb-up; two-thumbs-up; a finger swipe; a two-finger swipe; a three-finger swipe; a four-finger-swipe; a thumb plus one finger swipe; a thumb plus two finger swipe; etc. In embodiments, gestures inferred may include movement of a first digit in a first direction; and of a second digit in a substantially opposite direction. Gestures inferred may include a tickle.

Sensing of the intensity of light incident on an object may be employed in a number of applications. One such application includes estimation of ambient light levels incident upon an object so that the object's own light-emission intensity can be suitable selected. In mobile devices such as cell phones, personal digital assistants, smart phones, and the like, the battery life, and thus the reduction of the consumption of power, are of importance. At the same time, the visual display of information, such as through the use of a display such as those based on LCDs or pixellated LEDs, may also be needed. The intensity with which this visual information is displayed depends at least partially on the ambient illumination of the scene. For example, in very bright ambient lighting, more light intensity generally needs to be emitted by the display in order for the display's visual impression or image to be clearly visible above the background light level. When ambient lighting is weaker, it is feasible to consume less battery power by emitting a lower level of light from the display.

As a result, it is of interest to sense the light level near or in the display region. Existing methods of light sensing often include a single, or a very few, light sensors, often of small area. This can lead to undesired anomalies and errors in the estimation of ambient illumination levels, especially when the ambient illumination of the device of interest is spatially inhomogeneous. For example, shadows due to obscuring or partially obscuring objects may—if they obscure one or a few sensing elements—result in a display intensity that is less bright than desirable under the true average lighting conditions.

Embodiments include realization of a sensor, or sensors, that accurately permit the determination of light levels. Embodiments include at least one sensor realized using solution-processed light-absorbing materials. Embodiments include sensors in which colloidal quantum dot films constitute the primary light-absorbing element. Embodiments include systems for the conveyance of signals relating to the light level impinging on the sensor that reduce, or mitigate, the presence of noise in the signal as it travels over a distance between a passive sensor and active electronics that employ the modulation of electrical signals used in transduction. Embodiments include systems that include (1) the light-absorbing sensing element; (2) electrical interconnect for the conveyance of signals relating to the light intensity impinging upon the sensing element; and (3) circuitry that is remote from the light-absorbing sensing element, and is connected to it via the electrical interconnect, that achieves low-noise conveyance of the sensed signal through the electrical interconnect. Embodiments include systems in which the length of interconnect is more than one centimeter in length. Embodiments include systems in which interconnect does not require special shielding yet achieve practically useful signal-to-noise levels.

Embodiments include sensors, or sensor systems, that are employed, singly or in combination, to estimate the average color temperature illuminating the display region of a computing device. Embodiments include sensors, or sensor systems, that accept light from a wide angular range, such as greater than about +20° to normal incidence, or greater than about +30° to normal incidence, or greater than about +40° to normal incidence. Embodiments include sensors, or sensor systems, that include at least two types of optical filters, a first type passing primarily a first spectral band, a second type passing primarily a second spectral band. Embodiments include using information from at least two sensors employing at least two types of optical filters to estimate color temperature illuminating the display region, or a region proximate the display region.

Embodiments include systems employing at least two types of sensors. Embodiments include a first type constituted of a first light-sensing material, and a second type constituted of a second light-sensing material. Embodiments include a first light-sensing material configured to absorb, and transduce, light in a first spectral band, and a second light-sensing material configured to transduce a second spectral band. Embodiments include a first light-sensing material employing a plurality of nanoparticles having a first average diameter, and a second light-sensing material employing a plurality of nanoparticles have a second average diameter. Embodiments include a first diameter in the range of approximately 1 nm to approximately 2 nm, and a second diameter greater than about 2 nm.

Embodiments include methods of incorporating a light-sensing material into, or onto, a computing device involving ink-jet printing. Embodiments include using a nozzle to apply light-sensing material over a defined region. Embodiments include defining a primary light-sensing region using electrodes. Embodiments include methods of fabricating light sensing devices integrated into, or onto, a computing device involving: defining a first electrode; defining a second electrode; defining a light-sensing region in electrical communication with the first and the second electrode. Embodiments include methods of fabricating light sensing devices integrated into, or onto, a computing device involving: defining a first electrode; defining a light-sensing region; and defining a second electrode; where the light sensing region is in electrical communication with the first and the second electrode.

Embodiments include integration at least two types of sensors into, or onto, a computing device, using ink-jet printing. Embodiments include using a first reservoir containing a first light-sensing material configured to absorb, and transduce, light in a first spectral band; and using a second reservoir containing a second light-sensing material configured to absorb, and transduce, light in a second spectral band.

Embodiments include the use of differential or modulated signaling in order to substantially suppress any external interference. Embodiments include subtracting dark background noise.

Figure 22:
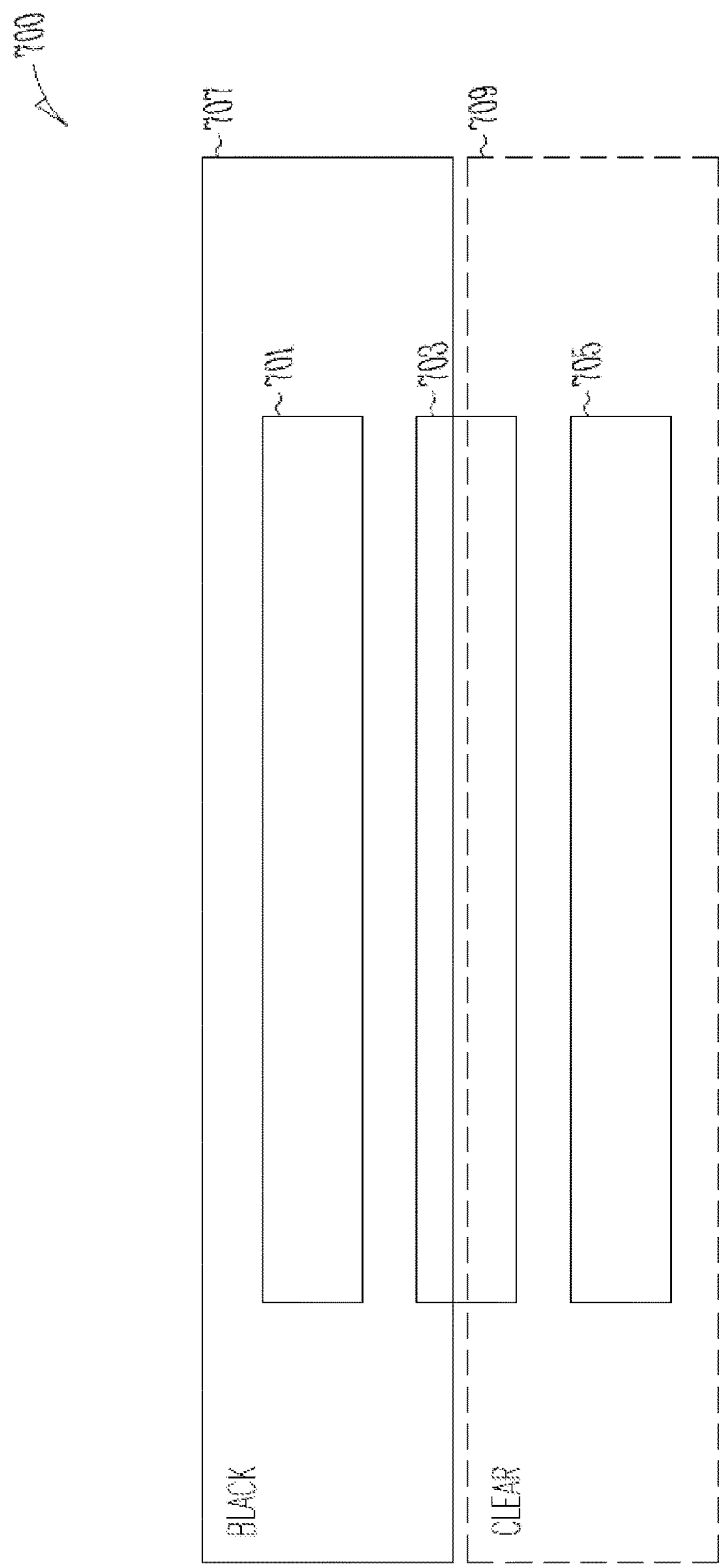
FIG. 22 shows an embodiment of a three-electrode differential-layout system to reduce external interferences with light sensing operations.

Embodiments include a differential system depicted in FIG. 22. FIG. 22 shows an embodiment of a three-electrode differential-layout system 700 to reduce external interferences with light sensing operations. The three-electrode differential-layout system 700 is shown to include a light sensing material covering all three electrodes 701, 703, 705. A light-obscuring material 707 (Black) prevents light from impinging upon the light-sensing material in a region that is electrically accessed using the first electrode 701 and the second electrode 703. A substantially transparent material 709 (Clear) allows light to impinge upon the light-sensing material in a substantially distinct region that is electrically accessed using the second electrode 703 and the third electrode 705. The difference in the current flowing through the Clear-covered electrode pair and the Black-covered electrode pair is equal to the photocurrent—that is, this difference does not include any dark current, but instead is proportional to the light intensity, with any dark offset substantially removed.

Embodiments include the use of a three-electrode system as follows. Each electrode consists of a metal wire. Light-absorbing material may be in electrical communication with the metal wires. Embodiments include the encapsulation of the light-absorbing material using a substantially transparent material that protects the light-absorbing material from ambient environmental conditions such as air, water, humidity, dust, and dirt. The middle of the three electrodes may be biased to a voltage V1, where an example of a typical voltage is about 0 V. The two outer electrodes may be biased to a voltage V2, where a typical value is about 3 V. Embodiments include covering a portion of the device using light-obscuring material that substantially prevents, or reduces, the incidence of light on the light-sensing material.

The light-obscuring material ensures that one pair of electrodes sees little or no light. This pair is termed the dark, or reference, electrode pair. The use of a transparent material over the other electrode pair ensures that, if light is incident, it is substantially incident upon the light-sensing material. This pair is termed the light electrode pair.

The difference in the current flowing through the light electrode pair and the dark electrode pair is equal to the photocurrent—that is, this difference does not include any dark current, but instead is proportional to the light intensity, with any dark offset substantially removed.

Figure 23:
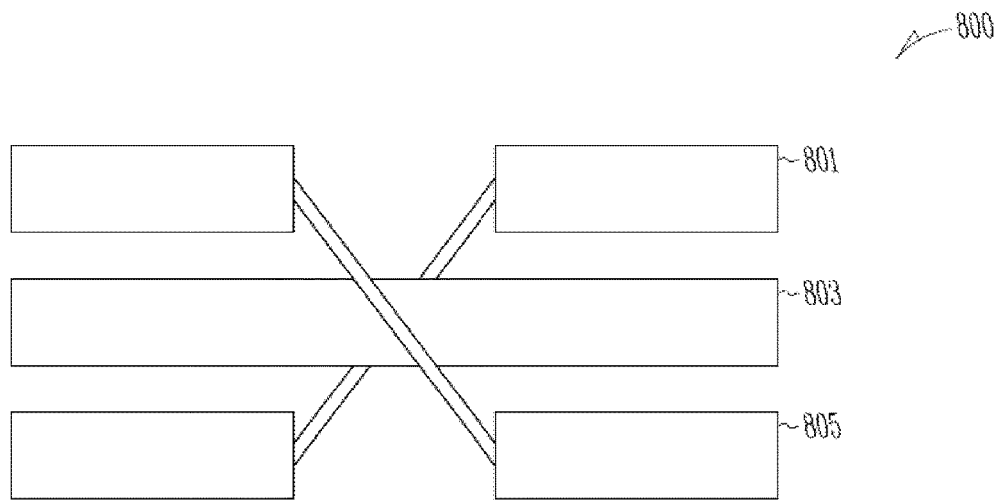
FIG. 23 shows an embodiment of a three-electrode twisted-pair layout system to reduce common-mode noise from external interferences in light sensing operations.

In embodiments, these electrodes are wired in twisted-pair form. In this manner, common-mode noise from external sources is reduced or mitigated. Referring to FIG. 23, electrodes 801, 803, 805 with twisted pair layout 800, the use of a planar analogue of a twisted-pair configuration leads to reduction or mitigation of common-mode noise from external sources.

In another embodiment, biasing may be used such that the light-obscuring layer may not be required. The three electrodes may be biased to three voltages V1, V2, and V3. In one example, V1=6 V, V2=3 V, V3=0 V. The light sensor between 6 V and 3 V, and that between 0 V and 3 V, will generate opposite-direction currents when read between 6 V and 0 V. The resultant differential signal is then transferred out in twisted-pair fashion.

In embodiments, the electrode layout may itself be twisted, further improving the noise-resistance inside the sensor. In this case, an architecture is used in which an electrode may cross over another.

Figure 24:
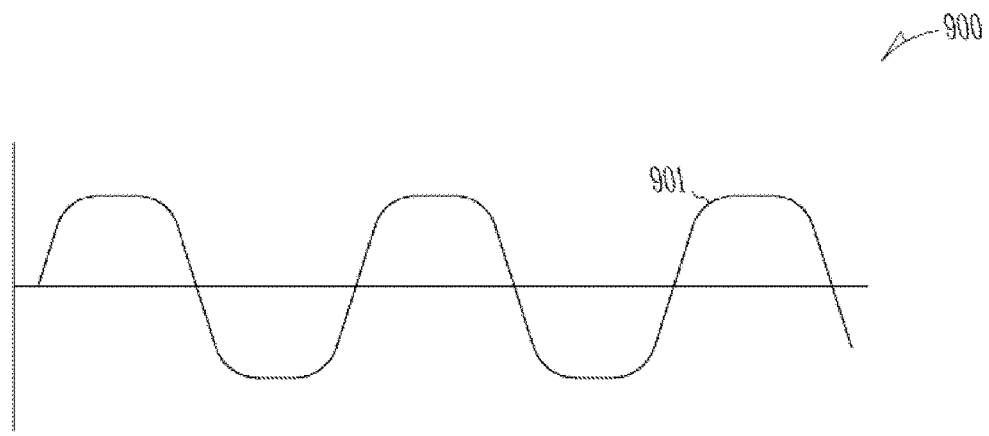
FIG. 24 is an embodiment of time-modulated biasing a signal applied to electrodes to reduce external noise that is not at the modulation frequency.

In embodiments, electrical bias modulation may be employed. An alternating bias may be used between a pair of electrodes. The photocurrent that flows will substantially mimic the temporal evolution of the time-varying electrical biasing. Readout strategies include filtering to generate a low-noise electrical signal. The temporal variations in the biasing include sinusoidal, square, or other periodic profiles. For example, referring to FIG. 24, an embodiment of time-modulated biasing 900 a signal 901 applied to electrodes to reduce external noise that is not at the modulation frequency. Modulating the signal in time allows rejection of external noise that is not at the modulation frequency.

Embodiments include combining the differential layout strategy with the modulation strategy to achieve further improvements in signal-to-noise levels.

Embodiments include employing a number of sensors having different shapes, sizes, and spectral response (e.g., sensitivities to different colors). Embodiments include generating multi-level output signals. Embodiments include processing signals using suitable circuits and algorithms to reconstruct information about the spectral and/or other properties of the light incident.

Advantages of the disclosed subject matter include transfer of accurate information about light intensity over longer distances than would otherwise be possible. Advantages include detection of lower levels of light as a result. Advantages include sensing a wider range of possible light levels. Advantages include successful light intensity determination over a wider range of temperatures, an advantage especially conferred when the dark reference is subtracted using the differential methods described herein.

Embodiments include a light sensor including a first electrode, a second electrode, and a third electrode. A light-absorbing semiconductor is in electrical communication with each of the first, second, and third electrodes. A light-obscuring material substantially attenuates the incidence of light onto the portion of light-absorbing semiconductor residing between the second and the third electrodes, where an electrical bias is applied between the second electrode and the first and third electrodes and where the current flowing through the second electrode is related to the light incident on the sensor.

Embodiments include a light sensor including a first electrode, a second electrode, and a light-absorbing semiconductor in electrical communication with the electrodes wherein a time-varying electrical bias is applied between the first and second electrodes and wherein the current flowing between the electrodes is filtered according to the time-varying electrical bias profile, wherein the resultant component of current is related to the light incident on the sensor.

Embodiments include the above embodiments where the first, second, and third electrodes consists of a material chosen from the list: gold, platinum, palladium, silver, magnesium, manganese, tungsten, titanium, titanium nitride, titanium dioxide, titanium oxynitride, aluminum, calcium, and lead.

Embodiments include the above embodiments where the light-absorbing semiconductor includes materials taken from the list: PbS, PbSe, PbTe, SnS, SnSe, SnTe, CdS, CdSe, CdTe, $Bi_2S_3$, $In_2S_3$, $In_2S_3$, $In_2Te_3$, ZnS, ZnSe, ZnTe, Si, Ge, GaAs, polypyrolle, pentacene, polyphenylenevinylene, polyhexylthiophene, and phenyl-C61-butyric acid methyl ester.

Embodiments include the above embodiments where the bias voltages are greater than about 0.1 V and less than about 10 V. Embodiments include the above embodiments where the electrodes are spaced a distance between about 1 µm and about 20 µm from one another.

Embodiments include the above embodiments where the distance between the light-sensing region and active circuitry used in biasing and reading is greater than about 1 cm and less than about 30 cm.

The capture of visual information regarding a scene, such as via imaging, is desired in a range of areas of application. In cases, the optical properties of the medium residing between the imaging system, and the scene of interest, may exhibit optical absorption, optical scattering, or both. In cases, the optical absorption and/or optical scattering may occur more strongly in a first spectral range compared to a second spectral range. In cases, the strongly-absorbing-or-scattering first spectral range may include some or all of the visible spectral range of approximately 470 nm to approximately 630 nm, and the more-weakly-absorbing-or-scattering second spectral range may include portions of the infrared spanning a range of approximately 650 nm to approximately 24 µm wavelengths.

In embodiments, image quality may be augmented by providing an image sensor array having sensitivity to wavelengths longer than about a 650 nm wavelength.

In embodiments, an imaging system may operate in two modes: a first mode for visible-wavelength imaging; and a second mode for infrared imaging. In embodiments, the first mode may employ a filter that substantially blocks the incidence of light of some infrared wavelengths onto the image sensor.

Figure 25:
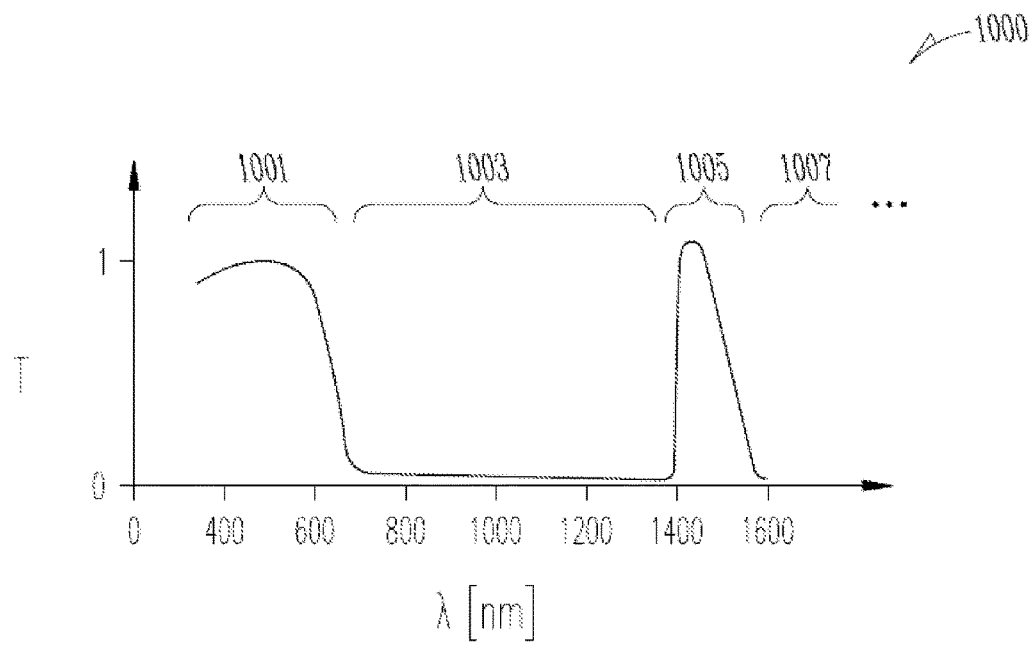
FIG. 25 shows an embodiment of a transmittance spectrum of a filter that may be used in various imaging applications.

Referring now to FIG. 25, an embodiment of a transmittance spectrum 1000 of a filter that may be used in various imaging applications. Wavelengths in the visible spectral region 1001 are substantially transmitted, enabling visible-wavelength imaging. Wavelengths in the infrared bands 1003 of approximately 750 nm to approximately 1450 nm, and also in a region 1007 beyond about 1600 nm, are substantially blocked, reducing the effect of images associated with ambient infrared lighting. Wavelengths in the infrared band 1005 of approximately 1450 nm to approximately 1600 nm are substantially transmitted, enabling infrared-wavelength imaging when an active source having its principal spectral power within this band is turned on.

In embodiments, an imaging system may operate in two modes: a first mode for visible-wavelength imaging; and a second mode for infrared imaging. In embodiments, the system may employ an optical filter, which remains in place in each of the two modes, that substantially blocks incidence of light over a first infrared spectral band; and that substantially passes incidence of light over a second infrared spectral band. In embodiments, the first infrared spectral band that is blocked may span from about 700 nm to about 1450 nm. In embodiments, the second infrared spectral band that is substantially not blocked may begin at about 1450 nm. In embodiments, the second infrared spectral band that is substantially not blocked may end at about 1600 nm. In embodiments, in the second mode for infrared imaging, active illuminating that includes power in the second infrared spectral band that is substantially not blocked may be employed. In embodiments, a substantially visible-wavelength image may be acquired via image capture in the first mode. In embodiments, a substantially actively-infrared-illuminated image may be acquired via image capture in the second mode. In embodiments, a substantially actively-infrared-illuminated image may be acquired via image capture in the second mode aided by the subtraction of an image acquired during the first mode. In embodiments, a periodic-in-time alternation between the first mode and second mode may be employed. In embodiments, a periodic-in-time alternation between no-infrared-illumination, and active-infrared-illumination, may be employed. In embodiments, a periodic-in-time alternation between reporting a substantially visible-wavelength image, and reporting a substantially actively-illuminated-infrared image, may be employed. In embodiments, a composite image may be generated which displays, in overlaid fashion, information relating to the visible-wavelength image and the infrared-wavelength image. In embodiments, a composite image may be generated which uses a first visible-wavelength color, such as blue, to represent the visible-wavelength image; and uses a second visible-wavelength color, such as red, to represent the actively-illuminated infrared-wavelength image, in a manner that is overlaid.

In image sensors, a nonzero, nonuniform, image may be present even in the absence of illumination, (in the dark). If not accounted for, the dark images can lead to distortion and noise in the presentation of illuminated images.

In embodiments, an image may be acquired that represents the signal present in the dark. In embodiments, an image may be presented at the output of an imaging system that represents the difference between an illuminated image and the dark image. In embodiments, the dark image may be acquired by using electrical biasing to reduce the sensitivity of the image sensor to light. In embodiments, an image sensor system may employ a first time interval, with a first biasing scheme, to acquire a substantially dark image; and a second time interval, with a second biasing scheme, to acquire a light image. In embodiments, the image sensor system may store the substantially dark image in memory; and may use the stored substantially dark image in presenting an image that represents the difference between a light image and a substantially dark image. Embodiments include reducing distortion, and reducing noise, using the method.

In embodiments, a first image may be acquired that represents the signal present following reset; and a second image may be acquired that represents the signal present following an integration time; and an image may be presented that represents the difference between the two images. In embodiments, memory may be employed to store at least one of two of the input images. In embodiments, the result difference image may provide temporal noise characteristics that are consistent with correlated double-sampling noise. In embodiments, an image may be presented having equivalent temporal noise considerable less than that imposed by sqrt(kTC) noise.

Embodiments include high-speed readout of a dark image; and of a light image; and high-speed access to memory and high-speed image processing; to present a dark-subtracted image to a user rapidly.

Embodiments include a camera system in which the interval between the user indicating that an image is to be acquired; and in which the integration period associated with the acquisition of the image; is less than about one second. Embodiments include a camera system that includes a memory element in between the image sensor and the processor.

Embodiments include a camera system in which the time in between shots is less than about one second.

Embodiments include a camera system in which a first image is acquired and stored in memory; and a second image is acquired; and a processor is used to generate an image that employs information from the first image and the second image. Embodiments include generating an image with high dynamic range by combining information from the first image and the second image. Embodiments include a first image having a first focus; and a second image having a second focus; and generating an image from the first image and the second image having higher equivalent depth of focus.

Hotter objects generally emit higher spectral power density at shorter wavelengths than do colder objects. Information may thus be extracted regarding the relative temperatures of objects imaged in a scene based on the ratios of power in a first band to the power in a second band.

In embodiments, an image sensor may comprise a first set of pixels configured to sense light primarily within a first spectral band; and a second set of pixels configured to sense light primarily within a second spectral band. In embodiments, an inferred image may be reported that combines information from proximate pixels of the first and second sets. In embodiments, an inferred image may be reported that provides the ratio of signals from proximate pixels of the first and second sets.

In embodiments, an image sensor may include a means of estimating object temperature; and may further include a means of acquiring visible-wavelength images. In embodiments, image processing may be used to false-color an image representing estimated relative object temperature atop a visible-wavelength image.

In embodiments, the image sensor may include at least one pixel having linear dimensions less than approximately 2 µm×2 µm.

In embodiments, the image sensor may include a first layer providing sensing in a first spectral band; and a second layer providing sensing in a second spectral band.

In embodiments, visible images can be used to present a familiar representation to users of a scene; and infrared images can provide added information, such as regarding temperature, or pigment, or enable penetration through scattering and/or visible-absorbing media such as fog, haze, smoke, or fabrics.

In cases, it may be desired to acquire both visible and infrared images using a single image sensor. In cases, registration among visible and infrared images is thus rendered substantially straightforward.

In embodiments, an image sensor may employ a single class of light-absorbing light-sensing material; and may employ a patterned layer above it that is responsible for spectrally-selective transmission of light through it, also known as a filter. In embodiments, the light-absorbing light-sensing material may provide high-quantum-efficiency light sensing over both the visible and at least a portion of the infrared spectral regions. In embodiments, the patterned layer may enable both visible-wavelength pixel regions, and also infrared-wavelength pixel regions, on a single image sensor circuit.

In embodiments, an image sensor may employ two classes of light-absorbing light-sensing materials: a first material configured to absorb and sense a first range of wavelengths; and a second material configured to absorb and sense a second range of wavelengths. The first and second ranges may be at least partially overlapping, or they may not be overlapping.

In embodiments, two classes of light-absorbing light-sensing materials may be placed in different regions of the image sensor. In embodiments, lithography and etching may be employed to define which regions are covered using which light-absorbing light-sensing materials. In embodiments, ink-jet printing may be employed to define which regions are covered using which light-absorbing light-sensing materials.

In embodiments, two classes of light-absorbing light-sensing materials may be stacked vertically atop one another. In embodiments, a bottom layer may sense both infrared and visible light; and a top layer may sense visible light principally.

In embodiments, an optically-sensitive device may include: a first electrode; a first light-absorbing light-sensing material; a second light-absorbing light-sensing material; and a second electrode. In embodiments, a first electrical bias may be provided between the first and second electrodes such that photocarriers are efficiently collected primarily from the first light-absorbing light-sensing material. In embodiments, a second electrical bias may be provided between the first and second electrodes such that photocarriers are efficiently collected primarily from the second light-absorbing light-sensing material. In embodiments, the first electrical bias may result in sensitivity primarily to a first wavelength of light. In embodiments, the second electrical bias may result in sensitivity primarily to a second wavelength of light. In embodiments, the first wavelength of light may be infrared; and the second wavelength of light may be visible. In embodiments, a first set of pixels may be provided with the first bias; and a second set of pixels may be provided with the second bias; ensuring that the first set of pixels responds primarily to a first wavelength of light, and the second set of pixels responds primarily to a second wavelength of light.

In embodiments, a first electrical bias may be provided during a first period of time; and a second electrical bias may be provided during a second period of time; such that the image acquired during the first period of time provides information primarily regarding a first wavelength of light; and the image acquired during the second period of time provides information primarily regarding a second wavelength of light. In embodiments, information acquired during the two periods of time may be combined into a single image. In embodiments, false-color may be used to represent, in a single reported image, information acquired during each of the two periods of time.

In embodiments, a focal plane array may consist of a substantially laterally-spatially uniform film having a substantially laterally-uniform spectral response at a given bias; and having a spectral response that depends on the bias. In embodiments, a spatially nonuniform bias may be applied, for example, different pixel regions may bias the film differently. In embodiments, under a given spatially-dependent biasing configuration, different pixels may provide different spectral responses. In embodiments, a first class of pixels may be responsive principally to visible wavelengths of light, while a second class of pixels may be responsive principally to infrared wavelengths of light. In embodiments, a first class of pixels may be responsive principally to one visible-wavelength color, such as blue; and a second class of pixels may be responsive principally to a distinctive visible-wavelength color, such as green; and a third class of pixels may be responsive principally to a distinctive visible-wavelength color, such as red.

In embodiments, an image sensor may comprise a readout integrated circuit, at least one pixel electrode of a first class, at least one pixel electrode of a second class, a first layer of optically sensitive material, and a second layer of optically sensitive material. In embodiments, the image sensor may employ application of a first bias for the first pixel electrode class; and of a second bias to the second pixel electrode class.

In embodiments, those pixel regions corresponding to the first pixel electrode class may exhibit a first spectral response; and of the second pixel electrode class may exhibit a second spectral response; where the first and second spectral responses are significantly different. In embodiments, the first spectral response may be substantially limited to the visible-wavelength region. In embodiments, the second spectral response may be substantially limited to the visible-wavelength region. In embodiments, the second spectral response may include both portions of the visible and portions of the infrared spectral regions.

In embodiments, it may be desired to fabricate an image sensor having high quantum efficiency combined with low dark current.

In embodiments, a device may consist of: a first electrode; a first selective spacer; a light-absorbing material; a second selective spacer; and a second electrode.

In embodiments, the first electrode may be used to extract electrons. In embodiments, the first selective spacer may be used to facilitate the extraction of electrons but block the injection of holes. In embodiments, the first selective spacer may be an electron-transport layer. In embodiments, the light-absorbing material may include semiconductor nanoparticles. In embodiments, the second selective spacer may be used to facilitate the extraction of holes but block the injection of electrons. In embodiments, the second selective spacer may be a hole-transport layer.

In embodiments, only a first selective spacer may be employed. In embodiments, the first selective spacer may be chosen from the list: $TiO_2$, ZnO, and ZnS. In embodiments, the second selective spacer may be NiO. In embodiments, the first and second electrode may be made using the same material. In embodiments, the first electrode may be chosen from the list: TiN, W, Al, and Cu. In embodiments, the second electrode may be chosen from the list: ZnO, Al:ZnO, ITO, $MoO_3$, Pedot, and Pedot:PSS.

In embodiments, it may be desired to implement an image sensor in which the light-sensing element can be configured during a first interval to accumulate photocarriers; and during a second interval to transfer photocarriers to another node in a circuit.

Embodiments include a device comprising: a first electrode; a light sensing material; a blocking layer; and a second electrode.

Embodiments include electrically biasing the device during a first interval, known as the integration period, such that photocarriers are transported towards the first blocking layer; and where photocarriers are stored near the interface with the blocking layer during the integration period.

Embodiments include electrically biasing the device during a second interval, known as the transfer period, such that the stored photocarriers are extracted during the transfer period into another node in a circuit.

Embodiments include a first electrode chosen from the list: TiN, W, Al, Cu. In embodiments, the second electrode may be chosen from the list: ZnO, Al:ZnO, ITO, $MoO_3$, Pedot, and Pedot:PSS. In embodiments, the blocking layer be chosen from the list: $HfO_2$, $Al_2O_3$, NiO, $TiO_2$, and ZnO.

In embodiments, the bias polarity during the integration period may be opposite to that during the transfer period. In embodiments, the bias during the integration period may be of the same polarity as that during the transfer period. In embodiments, the amplitude of the bias during the transfer period may be greater than that during the integration period.

Embodiments include a light sensor in which an optically sensitive material functions as the gate of a silicon transistor. Embodiments include devices comprising: a gate electrode coupled to a transistor; an optically sensitive material; a second electrode. Embodiments include the accumulation of photoelectrons at the interface between the gate electrode and the optically sensitive material. Embodiments include the accumulation of photoelectrons causing the accumulation of holes within the channel of the transistor. Embodiments include a change in the flow of current in the transistor as a result of a change in photoelectrons as a result of illumination. Embodiments include a change in current flow in the transistor greater than 1000 electrons/s for every electron/s of change in the photocurrent flow in the optically sensitive layer. Embodiments include a saturation behavior in which the transistor current versus photons impinged transfer curve has a sublinear dependence on photon fluence, leading to compression and enhanced dynamic range. Embodiments include resetting the charge in the optically sensitive layer by applying a bias to a node on the transistor that results in current flow through the gate during the reset period.

Embodiments include combinations of the above image sensors, camera systems, fabrication methods, algorithms, and computing devices, in which at least one image sensor is capable of operating in global electronic shutter mode.

In embodiments, at least two image sensors, or image sensor regions, may each operate in global shutter mode, and may provide substantially synchronous acquisition of images of distinct wavelengths, or from different angles, or employing different structured light.

Figure 26:
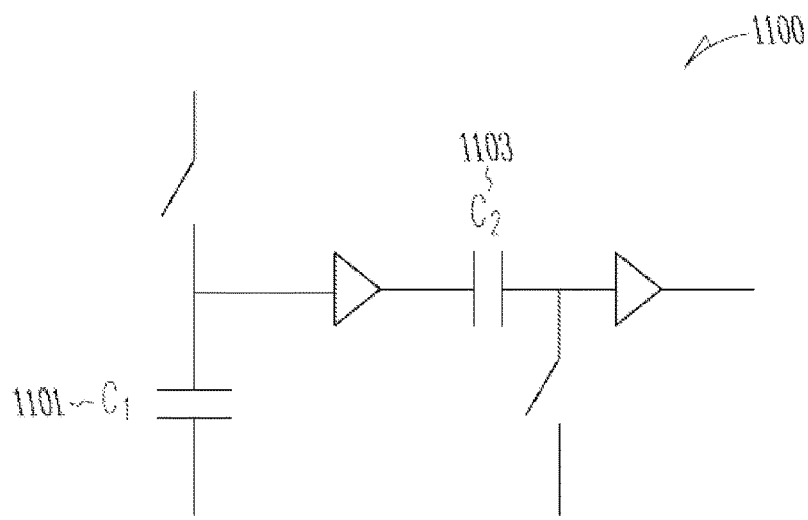
FIG. 26 shows an example schematic diagram of a circuit that may be employed within each pixel to reduce noise power.

Embodiments include implementing correlated double-sampling in the analog domain. Embodiments include so doing using circuitry contained within each pixel. FIG. 26 shows an example schematic diagram of a circuit 1100 that may be employed within each pixel to reduce noise power. In embodiments, a first capacitor 1101 (C1) and a second capacitor 1103 (C2) are employed in combination as shown. In embodiments, the noise power is reduced according to the ratio C2/C1.

Figure 27:
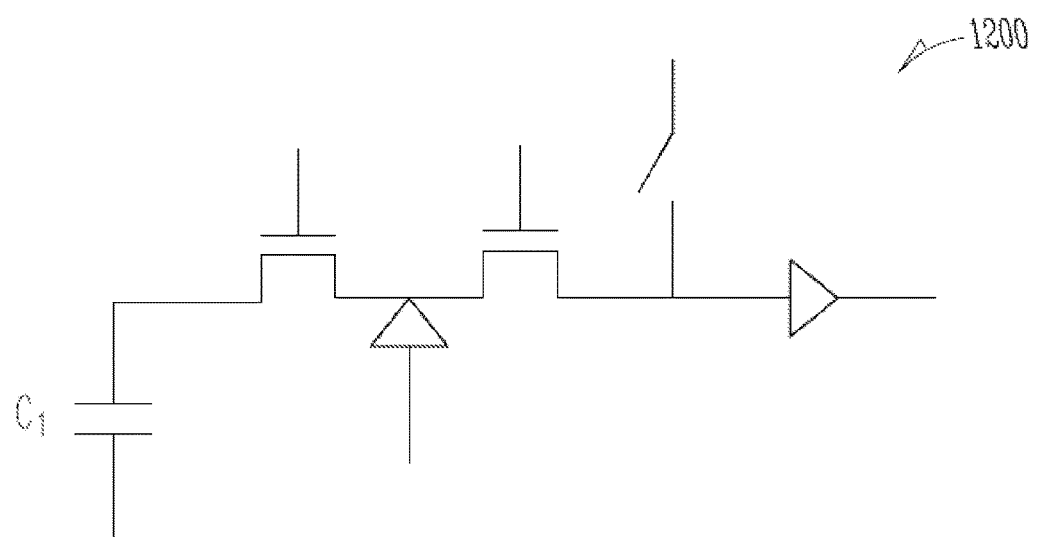
FIG. 27 shows an example schematic diagram of a circuit of a photoGate/pinned-diode storage that may be implemented in silicon.

FIG. 27 shows an example schematic diagram of a circuit 1200 of a photoGate/pinned-diode storage that may be implemented in silicon. In embodiments, the photoGate/pinned-diode storage in silicon is implemented as shown. In embodiments, the storage pinned diode is fully depleted during reset. In embodiments, C1 (corresponding to the light sensor's capacitance, such as quantum dot film in embodiments) sees a constant bias.

In embodiments, light sensing may be enabled through the use of a light sensing material that is integrated with, and read using, a readout integrated circuit. Example embodiments of same are included in U.S. Provisional Application No. 61/352,409, entitled, "Stable, Sensitive Photodetectors and Image Sensors Made Therefrom Including Circuits for Enhanced Image Performance," and U.S. Provisional Application No. 61/352,410, entitled, "Stable, Sensitive Photodetectors and Image Sensors Made Therefrom Including Processes and Materials for Enhanced Image Performance," both filed Jun. 8, 2010, which are hereby incorporated by reference in their entirety.

In embodiments, a method of gesture recognition is provided where the method includes acquiring a stream, in time, of at least two images from each of at least one camera module; acquiring a stream, in time, of at least two signals from each of at least one light sensor; and conveying the at least two images and the at least two signals to a processor, the processor being configured to generate an estimate of a gesture's meaning, and timing, based on a combination of the at least two images and the at least two signals.

In embodiments, the at least one light sensor includes a light-absorbing material having an absorbance, across the visible wavelength region of about 450 nm to about 650 nm, of less than about 30%.

In embodiments, the light-absorbing material includes PBDTT-DPP, the near-infrared light-sensitive polymer poly (2,60-4,8-bis(5-ethylhexylthienyl)benzo-[1,2-b;3,4-b]dithiophene-alt-5-dibutyloctyl-3,6-bis(5-bromothiophen-2-yl) pyrrolo[3,4-c]pyrrole-1,4-dione).

In embodiments, the at least one light sensor includes a light-sensing material capable of sensing infrared light.

In embodiments, the method includes modulating a light source using at least one code selected from spatial codes and temporal codes.

In embodiments, the light source has an emission wavelength in the range of about 900 nm to about 1000 nm.

In one embodiment, a camera system includes a central imaging array region, at least one light-sensing region outside of the central imaging array region, a first mode, referred to as imaging mode, and a second mode, referred to as sensing mode. The electrical power consumed in the second mode is at least 10 times lower than the electrical power consumed in the first mode.

In embodiments, the at least one light sensor includes a light-sensing material capable of sensing infrared light.

In embodiments, light impinging on the light-sensing material is to be modulated.

In embodiments, a portion of light impinging on the light-sensing material is to be generated using a light emitter device having an emission wavelength in the range of about 800 nm to about 1000 nm.

In embodiments, the central imaging array includes at least six megapixels.

In embodiments, the central imaging array comprises pixels less than approximately 2 µm in width and approximately 2 µm in height.

In one embodiment, an image sensor circuit includes a central imaging array region having a first field of view; and at least one light-sensing region outside of the central imaging array region having a second field of view. The second field of view is less than half, measured in angle, the field of view of the first field of view.

In one embodiment, an integrated circuit includes a substrate, an image sensing array region occupying a first region of said semiconductor substrate and including a plurality of optically sensitive pixel regions, a pixel circuit for each pixel region, each pixel circuit comprising a charge store and a read-out circuit, and a light-sensitive region outside of the image sensing array region. The image sensing array region having a first field of view and the light-sensitive region having a second field of view; the angle of the second field of view is less than half of the angle of the first field of view.

In embodiments, at least one of the image sensing array and the light-sensitive region outside of the image sensing array region includes a light-sensing material capable of sensing infrared light.

In embodiments, light impinging on at least one of the image sensing array and the light-sensitive region outside of the image sensing array region is to be modulated.

In embodiments, a portion of light impinging on at least one of the image sensing array and the light-sensitive region outside of the image sensing array region is to be generated using a light emitter device having an emission wavelength in the range of about 800 nm to about 1000 nm.

In embodiments, the image sensing array includes at least six megapixels.

In embodiments, the image sensing array comprises pixels less than approximately 2 µm in width and approximately 2 µm in height.

In one embodiment, an image sensor includes a central imaging array region to provide pixelated sensing of an image, in communication with a peripheral region that includes circuitry to provide biasing, readout, analog-to-digital conversion, and signal conditioning to the pixelated light sensing region. An optically sensitive material overlies the peripheral region.

In embodiments, the at least one light sensor includes a light-sensing material capable of sensing infrared light.

In embodiments, light impinging on the light-sensing material is to be modulated.

In embodiments, a portion of light impinging on the light-sensing material is to be generated using a light emitter device having an emission wavelength in the range of about 800 nm to about 1000 nm.

In embodiments, the central imaging array includes at least six megapixels.

In embodiments, the central imaging array comprises pixels less than approximately 2 µm in width and approximately 2 µm in height.

In embodiments, the optically sensitive material is chosen to include at least one material from a list, the list including silicon, colloidal quantum dot film, and a semiconducting polymer.

In embodiments, the optically sensitive material is fabricated on a first substrate, and is subsequently incorporated onto the central imaging array region.

The various illustrations of the methods and apparatuses provided herein are intended to provide a general understanding of the structure of various embodiments and are not intended to provide a complete description of all the elements and features of the apparatuses and methods that might make use of the structures, features, and materials described herein.

A person of ordinary skill in the art will appreciate that, for this and other methods disclosed herein, the activities forming part of various methods may, in certain cases, be implemented in a differing order, as well as repeated, executed simultaneously, or substituted one for another. Further, the outlined acts, operations, and apparatuses are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A pixel circuit, comprising:
    a first electrode coupled to a reset transistor and to a first region of an optically sensitive layer;
    a second electrode coupled to a pixel sense node and to a second region of the optically sensitive layer, the electrical path from the first electrode, through the optically sensitive layer, and into the second electrode, being configured to function as a variable resistor,
    wherein, in a first mode, the variable resistor exhibits a resistance of less than $10^9$ ohms.

2. The pixel circuit of claim 1, wherein, in the first mode, the sense node is reset to a potential determined by the reset transistor.

3. The pixel circuit of claim 1, wherein, in a second mode, the variable resistor exhibits a resistance exceeding $10^{16}$ ohms.

4. The pixel circuit of claim 3, wherein, in the second mode, the optically sensitive layer is substantially fully depleted of free carriers.

5. The pixel circuit of claim 3, wherein, in the second mode, the sense node potential changes at a rate related to the optical signal illuminating the optically sensitive layer.

6. The pixel circuit of claim 1, wherein, in a third mode, the first electrode is electrically coupled to the output of a feedback amplifier.

7. The pixel circuit of claim 6, wherein the feedback amplifier is configured to impose a voltage on the sense node that is specified to within a noise power that is appreciably less than kT/C.

8. The pixel circuit of claim 1, wherein the optically sensitive layer is sensitive to any of one or more wavelength regions of regions including infrared, visible, and ultraviolet regions of the electromagnetic spectrum.

9. The pixel circuit of claim 1, wherein the optically sensitive layer includes one or more types of quantum dot nanocrystals.

10. The pixel circuit of claim 9, wherein at least two of the one or more types of quantum dot nanocrystals are at least partially fused.

11. The pixel circuit of claim 1, wherein the optically sensitive layer includes a combination of at least two types of quantum dots, each of the at least two types of quantum dots including a distinct semiconductor material.

12. The pixel circuit of claim 1, wherein the optically sensitive layer includes a combination of at least two types of quantum dots, each of the at least two types of quantum dots having distinct properties.

13. The pixel circuit of claim 1, wherein the optically sensitive layer includes at least one of an optically sensitive semiconducting polymer selected from a list of polymers including MEH-PPV, P3OT, and P3HT.

14. The pixel circuit of claim 1, wherein the optically sensitive layer includes a polymer-quantum dot mixture having one or more types of quantum dots sensitive to different portions of the electromagnetic spectrum.

15. A pixel circuit, comprising:
    a first electrode coupled to a reset transistor and to a first region of an optically sensitive layer;
    a second electrode coupled to a pixel sense node and to a second region of the optically sensitive layer, the electrical path from the first electrode, through the optically sensitive layer, and into the second electrode, being configured to function as a variable resistor,
    wherein in a second mode, the variable resistor exhibits a resistance exceeding $10^{16}$ ohms.

16. The pixel circuit of claim 15, wherein, in the second mode, the optically sensitive layer is substantially fully depleted of free carriers.

17. The pixel circuit of claim 15, wherein, in the second mode, the sense node potential changes at a rate related to the optical signal illuminating the optically sensitive layer.

* * * * *